US012581219B2

(12) United States Patent
Kim

(10) Patent No.: US 12,581,219 B2
(45) Date of Patent: Mar. 17, 2026

(54) IMAGE SENSING DEVICE INCLUDING CHARGE STORAGE PIXELS AND A METHOD FOR OPERATING THE SAME

(71) Applicant: SK hynix Inc., Icheon-si (KR)

(72) Inventor: Sie Uoo Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 269 days.

(21) Appl. No.: 18/434,672

(22) Filed: Feb. 6, 2024

(65) Prior Publication Data

US 2024/0397230 A1    Nov. 28, 2024

(30) Foreign Application Priority Data

May 26, 2023    (KR) ......................... 10-2023-0068263

(51) Int. Cl.
| | |
|---|---|
| *H04N 25/771* | (2023.01) |
| *H04N 25/76* | (2023.01) |
| *H10F 39/00* | (2025.01) |

(52) U.S. Cl.
CPC ....... *H04N 25/771* (2023.01); *H04N 25/7795* (2023.01); *H10F 39/8037* (2025.01); *H10F 39/8053* (2025.01)

(58) Field of Classification Search
CPC ............. H04N 25/771; H04N 25/7795; H04N 25/778; H04N 25/77; H04N 25/135; H04N 25/621; H04N 25/704; H04N 25/50; H04N 25/59; H04N 25/57; H04N 25/766; H04N 25/10; H04N 25/42; H04N 25/46; H04N 23/741; H04N 25/44; H04N 25/78; H04N 25/585; H04N 25/616; H04N 25/622; H04N 23/54; H04N 25/00;

H10F 39/8037; H10F 39/8053; H10F 39/813; H10F 39/8063; H10F 39/802; H10F 39/803; H10D 84/856
See application file for complete search history.

(56) References Cited

U.S. PATENT DOCUMENTS

| | | | |
|---|---|---|---|
| 9,185,319 B2 | 11/2015 | Mayer et al. | |
| 9,508,770 B2 * | 11/2016 | Yanagita | ................ H10F 39/018 |
| 2014/0239152 A1 * | 8/2014 | Chen | .................... H10F 39/8023 |
| | | | 250/208.1 |
| 2014/0246568 A1 * | 9/2014 | Wan | ....................... H10F 39/802 |
| | | | 438/66 |
| 2018/0191969 A1 * | 7/2018 | Innocent | ................ H04N 25/77 |

(Continued)

*Primary Examiner* — Lin Ye
*Assistant Examiner* — Tuan H Le
(74) *Attorney, Agent, or Firm* — Perkins Coie LLP

(57) ABSTRACT

An image sensing device is provided to include first to third light subpixels configured to include first to third photoelectric conversion elements, respectively, each of the first to third photoelectric conversion elements configured to generate photocharges indicative of incident light received by each photoelectric conversion element; a first storage subpixel including a first storage element configured to store overflown photocharges that correspond to an excess of photocharges that are generated to exceed predetermined capacities of the first to third photoelectric conversion elements; and each of first to third path transistors electrically connected between the first storage element and each of the first to third photoelectric conversion elements, respectively, wherein the first to third light subpixels and the first storage subpixel are arranged in a (2×2) matrix to form a first pixel.

23 Claims, 17 Drawing Sheets

(56) References Cited

U.S. PATENT DOCUMENTS

| | | | | |
|---|---|---|---|---|
| 2020/0119060 | A1 | 4/2020 | Altice, Jr. et al. | |
| 2020/0350350 | A1* | 11/2020 | Krymski | H10F 39/8037 |
| 2021/0377435 | A1* | 12/2021 | Dai | H04N 23/741 |
| 2023/0199341 | A1* | 6/2023 | Ui | H04N 25/778 |
| | | | | 348/302 |
| 2023/0239595 | A1* | 7/2023 | Inada | H04N 25/40 |
| | | | | 348/207.99 |
| 2023/0362500 | A1* | 11/2023 | Shim | H04N 25/42 |

* cited by examiner

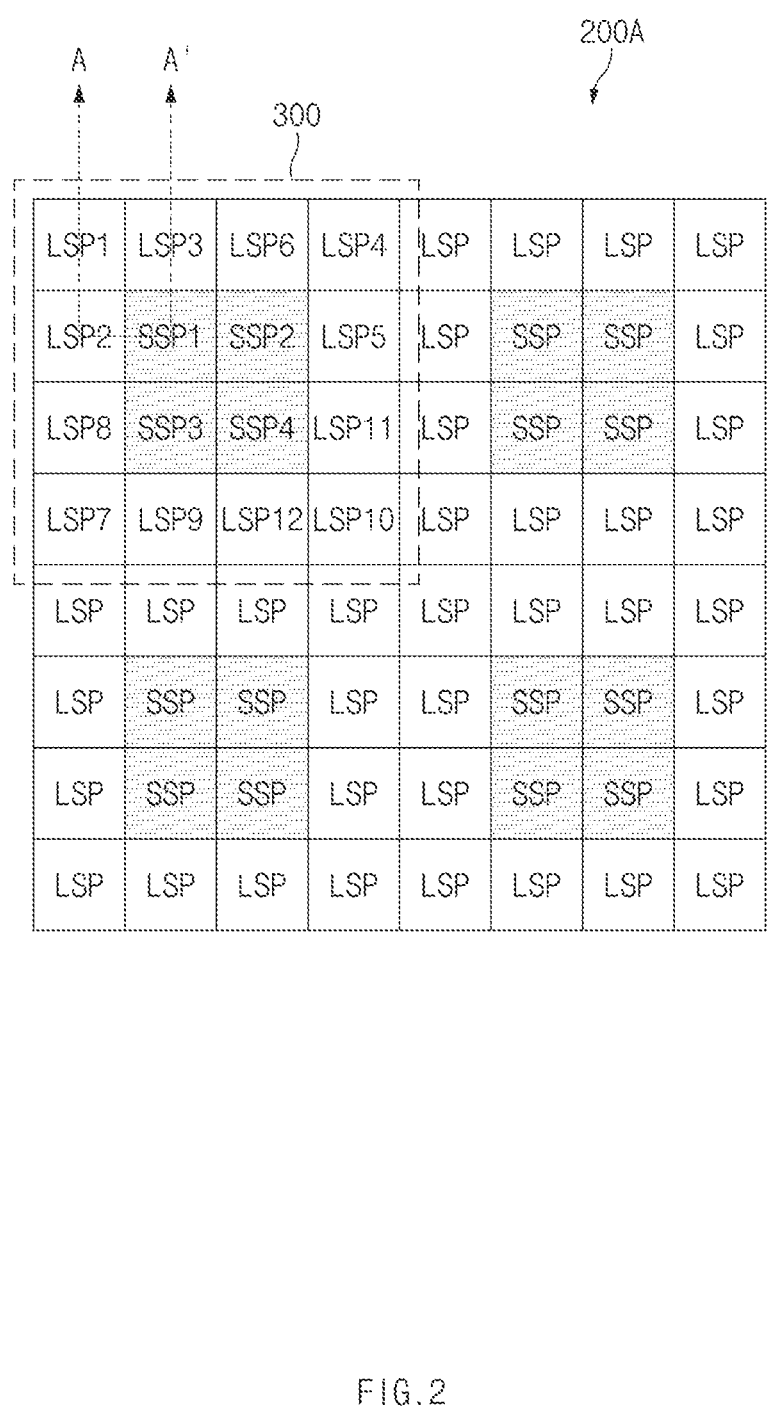

| LSP1 | LSP3 | LSP6 | LSP4 | LSP | LSP | LSP | LSP |
|------|------|------|------|-----|-----|-----|-----|
| LSP2 | SSP1 | SSP2 | LSP5 | LSP | SSP | SSP | LSP |
| LSP8 | SSP3 | SSP4 | LSP11 | LSP | SSP | SSP | LSP |
| LSP7 | LSP9 | LSP12 | LSP10 | LSP | LSP | LSP | LSP |
| LSP | LSP | LSP | LSP | LSP | LSP | LSP | LSP |
| LSP | SSP | SSP | LSP | LSP | SSP | SSP | LSP |
| LSP | SSP | SSP | LSP | LSP | SSP | SSP | LSP |
| LSP | LSP | LSP | LSP | LSP | LSP | LSP | LSP |

FIG.2

IMAGE SENSING DEVICE INCLUDING CHARGE STORAGE PIXELS AND A METHOD FOR OPERATING THE SAME

CROSS-REFERENCE TO RELATED APPLICATION

This patent document claims the priority and benefits of Korean patent application No. 10-2023-0068263, filed on May 26, 2023, the disclosure of which is incorporated by reference in its entirety as part of the disclosure of this patent document.

TECHNICAL FIELD

The technology and implementations disclosed in this patent document generally relate to an image sensing device and a method for operating the same, and more particularly to an image sensing device including storage pixels capable of storing charges therein, and a method for operating the same.

BACKGROUND

An image sensing device is a device for capturing at least one image using semiconductor characteristics that react to light incident thereon to produce an image. In recent times, with the increasing development of information technology (IT) industries and related technologies, the demand for high-quality and high-performance image sensing devices has been rapidly increasing in various electronic devices, for example, smartphones, digital cameras, etc.

Image sensing devices may be broadly classified into CCD(Charge Coupled Device)-based image sensing devices and CMOS(Complementary Metal Oxide Semiconductor)-based image sensing devices. Unlike in the past, CMOS image sensing devices have been intensively researched and rapidly come into widespread use.

SUMMARY

Various embodiments of the disclosed technology relate to an image sensing device including a pixel array having a plurality of pixels, and a method for operating the same. Various implementations of the disclosed technology can solve the problem in the conventional art, which relates to the difficulties to obtain pixel signals without errors due to the saturation of some pixels during a focusing. For example, in the conventional art, during the focusing, some pixels among the plurality of pixels are saturated in a process of comparing the respective pixel signals of the pixel array with each other, which makes it difficult to obtain the pixel signals without errors.

Various embodiments of the disclosed technology relate to an image sensing device including storage subpixels capable of storing photocharges generated in response to the amount of light incident upon adjacent light subpixels, thereby preventing a blooming phenomenon and others.

In accordance with an embodiment of the disclosed technology, an image sensing device may include first to third light subpixels configured to include first to third photoelectric conversion elements, respectively, each of the first to third photoelectric conversion elements configured to generate photocharges indicative of incident light received by each photoelectric conversion element; a first storage subpixel including a first storage element configured to store overflown photocharges that correspond to an excess of photocharges that are generated to exceed predetermined capacities of the first to third photoelectric conversion elements; and each of first to third path transistors electrically connected between the first storage element and each of the first to third photoelectric conversion elements, respectively, wherein the first to third light subpixels and the first storage subpixel are arranged in a (2×2) matrix to form a first pixel.

In some implementations, the first light subpixel may include a first optical filter configured to transmit light of a first color, the second light subpixel may include a second optical filter configured to transmit light of a second color, the third light subpixel may include a third optical filter configured to transmit light of a third color, and the first storage subpixel may include a first light blocking structure.

In some implementations, the first to third colors are same as one another.

In some implementations, the image sensing device may further include a first floating diffusion region configured to accumulate the photocharges generated by the first to third photoelectric conversion elements, and a row driver configured to supply a pixel control signal to a pixel array including the first pixel.

In some implementations, the image sensing device may further include a reset transistor configured to reset the first floating diffusion region to a power-supply voltage in response to a pixel reset signal received from the row driver, a drive transistor configured to convert a potential of the first floating diffusion region into an electrical signal, and a selection transistor configured to output the electrical signal in response to a row selection signal received from the row driver.

In some implementations, the pixel control signal may include a path selection signal supplied to the first path transistor, a row transfer signal supplied to a transfer transistor, the pixel reset signal, and the row selection signal, wherein the transfer transistor is electrically connected between the first floating diffusion region and any one of the first photoelectric conversion element and the first storage element. The path selection signal may have a high level, a low level, or a medium level that is lower than the high level and higher than the low level, and each of the row transfer signal, the pixel reset signal, and the row selection signal may have the high level or the low level.

In some implementations, an operation period of the first light subpixel may include a first period configured to remove photocharges present in the first photoelectric conversion element and the first storage element, a second period configured to accumulate photocharges corresponding to the incident light, a third period configured to reset the first floating diffusion region, and a fourth period configured to read out the first light subpixel.

In some implementations, in the first period, the first path transistor and the transfer transistor are configured to move the photocharges present in the first photoelectric conversion element and the first storage element to the first floating diffusion region in response to each of the path selection signal having the high level and the row transfer signal having the high level, and the reset transistor is configured to reset the first floating diffusion region storing the photocharges to a power-supply voltage in response to the pixel reset signal having the high level.

In some implementations, in the second period, the first path transistor is configured to move the photocharges generated from the first photoelectric conversion element to the first storage element in response to the path selection signal having the medium level, and the transfer transistor is configured to block the photocharges generated by the first photoelectric conversion element from moving to the first floating diffusion region in response to the row transfer signal having the low level.

In some implementations, in the third period, the transfer transistor may block the photocharges generated by the first photoelectric conversion element from moving to the first floating diffusion region in response to the row transfer signal having the low level, and the reset transistor may reset the first floating diffusion region to a power-supply voltage in response to the pixel reset signal having the high level.

In some implementations, in the fourth period, the first path transistor and the transfer transistor may move the photocharges generated by the first photoelectric conversion element to the first floating diffusion region in response to each of the path selection signal having the high level and the row transfer signal having the high level, the reset transistor may prevent the first floating diffusion region from being reset to a power-supply voltage in response to the pixel reset signal having the low level, and the selection transistor may output an electrical signal corresponding to the photocharges of the first floating diffusion region in response to the row selection signal having the high level.

In some implementations, the image sensing device may further include the first to third transfer transistors respectively electrically connected between the first floating diffusion region and each of the first to third photoelectric conversion elements.

In some implementations, the image sensing device may further include a second pixel configured to have fourth to sixth light subpixels and a second storage subpixel, a third pixel configured to have seventh to ninth light subpixels and a third storage subpixel, a fourth pixel configured to have tenth to twelfth light subpixels and a fourth storage subpixel, fourth to twelfth photoelectric conversion elements respectively included in the fourth to twelfth light subpixels, and second to fourth storage elements respectively included in the second to fourth storage subpixels. The fourth to sixth light subpixels and the second storage subpixel may be arranged in a (2×2) matrix structure to form the second pixel, the seventh to ninth light subpixels and the third storage subpixel may be arranged in a (2×2) matrix structure to form the third pixel, and the tenth to twelfth light subpixels and the fourth storage subpixel may be arranged in a (2×2) matrix structure to form the fourth pixel.

In some implementations, the image sensing device may further include each of the first to fourth transfer transistors electrically connected between the first floating diffusion region and each of the first to fourth storage elements.

In some implementations, the second pixel may be adjacent to the first pixel in a column direction, the third pixel may be adjacent to the first pixel in a row direction, and the fourth pixel may be adjacent to each of the second pixel and the third pixel and may be disposed in a diagonal direction from the first pixel.

In some implementations, each of the first to third light subpixels may include a first optical filter configured to transmit light of a first color, each of the fourth to sixth light subpixels may include a second optical filter configured to transmit light of a second color, each of the seventh to ninth light subpixels may include a third optical filter configured to transmit light of a third color, each of the tenth to twelfth light subpixels may include a fourth optical filter configured to transmit light of a fourth color, and the first to fourth storage subpixels may include first to fourth light blocking structures, respectively.

In some implementations, the first to fourth colors may be different from one another.

In some implementations, the first color may be green, the second color may be red, and the third color may be blue.

In some implementations, the image sensing device may further include a second floating diffusion region configured to accumulate the photocharges generated by the fourth to sixth photoelectric conversion elements, a third floating diffusion region configured to accumulate the photocharges generated by the seventh to ninth photoelectric conversion elements, a fourth floating diffusion region configured to accumulate the photocharges generated by the tenth to twelfth photoelectric conversion elements, first to third transfer transistors respectively connected between the first floating diffusion region and each of the first to third photoelectric conversion elements; fourth to sixth transfer transistors respectively connected between the second floating diffusion region and each of the fourth to sixth photoelectric conversion elements, seventh to ninth transfer transistors respectively connected between the third floating diffusion region and each of the seventh to ninth photoelectric conversion elements, and tenth to twelfth transfer transistors respectively connected between the fourth floating diffusion region and each of the tenth to twelfth photoelectric conversion elements.

In accordance with another embodiment of the disclosed technology, a method for operating an image sensing device may include: operating the image sensing device to perform a photocharge accumulation operation by applying a path selection signal having a first level to a path transistor electrically connected between a photoelectric conversion element configured to generate photocharges in response to incident light and a storage element storing the photocharges to form a predetermined charge barrier and restrict a movement of a photocharge between the photoelectric conversion element and the storage element; and operating the image sensing device to perform a pixel readout operation by applying the path selection signal having a second level higher than the first level to the path transistor to remove the predetermined charge barrier formed between the photoelectric conversion element and the storage element, wherein the photocharges move from the photoelectric conversion element to the storage element during the photocharge accumulation operation and the photocharges move to a floating diffusion region during the pixel readout operation.

In some implementations, the photocharge accumulation operation further includes: applying a pixel reset signal having the second level to a reset transistor electrically connected between the floating diffusion region and a power-supply voltage to reset a voltage of the floating diffusion region to the power-supply voltage.

In some implementations, the pixel readout operation further includes: applying a pixel reset signal having a third level less than the first level to a reset transistor disposed between the floating diffusion region and a power-supply voltage such that photocharges that have moved to the floating diffusion region are prevented from being reset to the power-supply voltage.

In some implementations, wherein the photocharges generated by the photoelectric conversion element move to the floating diffusion region by applying a row transfer signal having the second level to a transfer transistor that is connected between the storage element and the floating diffusion region or between the photoelectric conversion element and the floating diffusion region.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

FIG. 2 is a schematic diagram illustrating an example of a portion of a pixel array shown in FIG. 1 based on some implementations of the disclosed technology.

DETAILED DESCRIPTION

Figure 1:
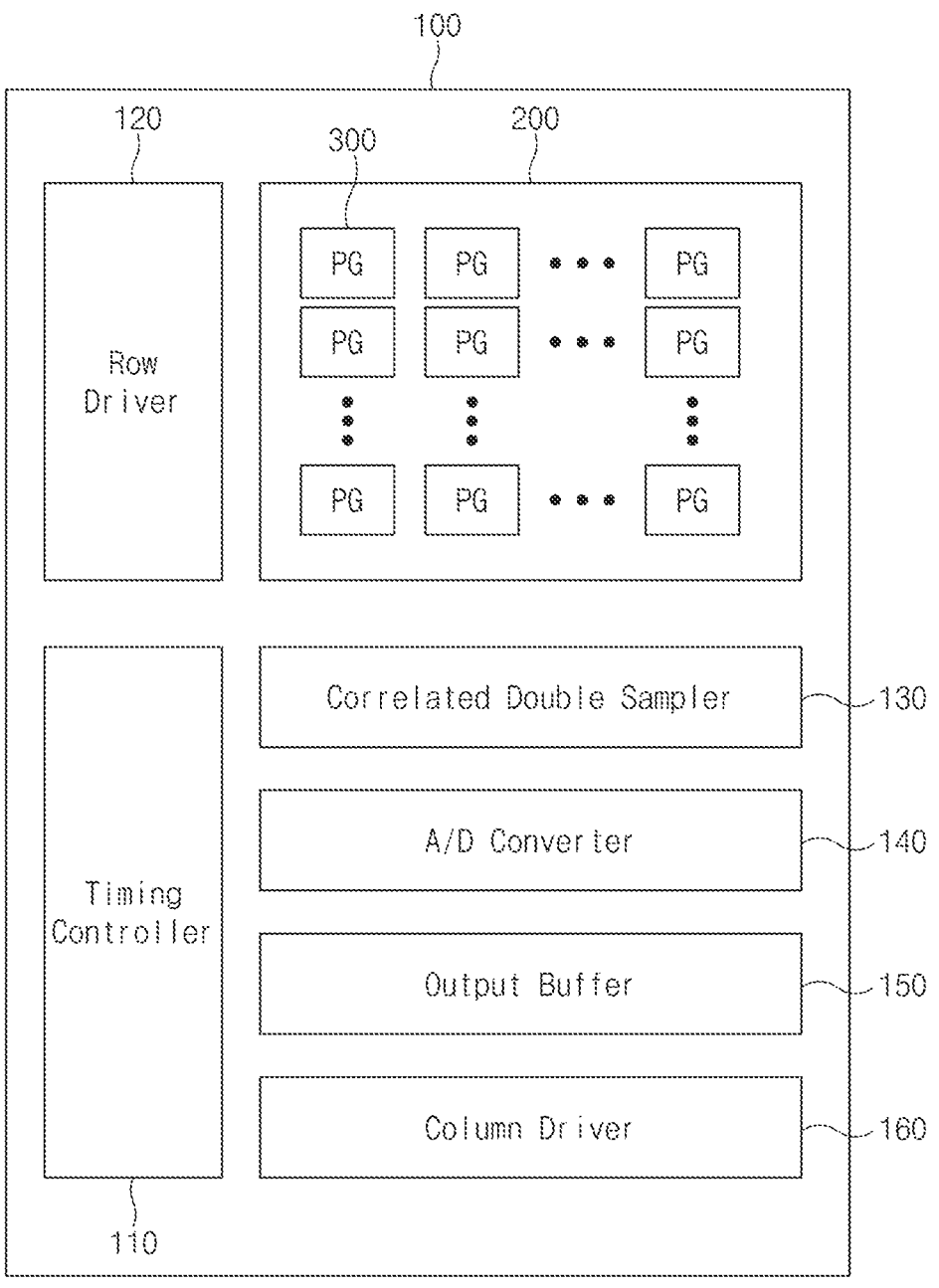
FIG. 1 is a block diagram illustrating an example of an image sensing device based on some implementations of the disclosed technology.

This patent document provides implementations and examples of an image sensing device including storage pixels capable of storing charges therein, and a method for operating the same, that may be used in configurations to substantially address one or more technical or engineering issues and to mitigate limitations or disadvantages encountered in some other image sensing device designs. Some implementations of the disclosed technology relate to an image sensing device including a pixel array in which a pixel structure having a plurality of pixels is arranged, and a method for operating the image sensing device, which can solve the problem that it is difficult to read normal pixel signals when some pixels from among the plurality of pixels are first saturated in a process of comparing the respective pixel signals of the pixel array with each other to perform focusing. Some implementations of the disclosed technology relate to an image sensing device including at least one storage subpixel capable of storing photocharges generated in response to the amount of light incident upon adjacent light subpixels, thereby preventing a blooming phenomenon and others. In recognition of the issues above, the disclosed technology provides the image sensing device that can perform focusing by comparing signals of left/right/upper/lower pixels located around the plurality of subpixels, and can normally read pixel signals by including storage subpixels capable of storing overflown photocharges of pixels previously saturated by incident light, thereby increasing the storage capacity capable of storing generated photocharges, so that the image sensing device can prevent occurrence of error signals that may occur in other pixels affected by a blooming phenomenon.

Hereafter, examples of various embodiments are described with reference to the accompanying drawings. It should be understood that the disclosed technology is not limited to specific embodiments, but includes various modifications, equivalents and/or alternatives of the embodiments. Implementations of embodiments of the disclosed technology may be possible to provide a variety of effects capable of being directly or indirectly recognized through the disclosed technology.

In describing the components of the embodiments of the disclosed technology, various terms such as first, second, etc., may be used solely for the purpose of differentiating one component from another, but the essence, order and sequence of the components are not limited to these terms. Unless defined otherwise, all terms, including technical and scientific terms, used in the disclosed technology may have the same meaning as commonly understood by a person having ordinary skill in the art to which the disclosed technology pertains. It will be further understood that terms, such as those defined in commonly used dictionaries, may be interpreted as having a meaning that is consistent with their meaning in the context of the related art and the disclosed technology, and may not be interpreted in an idealized or overly formal sense unless expressly so defined herein.

FIG. 1 is a block diagram illustrating an example of an image sensing device 100 based on some implementations of the disclosed technology.

Referring to FIG. 1, the image sensing device 100 based on some implementations of the disclosed technology may include a timing controller 110, a row driver 120, a pixel array 200, a correlated double sampler (CDS) 130, an analog-to-digital converter (ADC) 140, an output buffer 150, and a column driver 160. The components of the image sensing device illustrated in FIG. 1 are discussed by way of example only, and this patent document encompasses numerous other changes, substitutions, variations, alterations, and modifications. In this patent document, the word "pixel" can be used to indicate an image sensing pixel that is structured to detect incident light to generate electrical signals carrying images in the incident light.

The timing controller 110 may provide timing signals and control signals to at least one of the row driver 120, the correlated double sampler (CDS) 130, the ADC 140, the output buffer 150, and the column driver 160.

The row driver 120 may activate the pixel array 200 to perform specific operations on pixels included in a corresponding row based on the timing and control signals received from the timing controller 110.

In some implementations, the row driver 120 may select at least one pixel arranged in at least one row of the pixel array 200, and may provide the selected pixel with a control signal for performing a specific operation. The row driver

120 may generate a row selection signal to select at least one row from among a plurality of rows. When the row driver 120 selects a specific row from among the plurality of rows to perform a specific operation, the row driver 120 may not perform the specific operation on a row adjacent to the selected specific row.

The pixels of the row selected by the row driver 120 may sequentially transfer analog reference signals and image signals to the correlated double sampler (CDS) 130. The reference signal may be an electrical signal provided to the CDS 130 when a floating diffusion region of each pixel is reset to a power-supply voltage VDD. The image signal may be an electrical signal provided to the CDS 130 when photocharges generated by each pixel are accumulated in the floating diffusion (FD) region.

The reference signal may be a signal indicating unique pixel noise of each pixel, and the reference signal and the image signal may be collectively referred to as a pixel signal as necessary.

The pixel array 200 may include a plurality of pixels arranged in a plurality of rows and a plurality of columns. The plurality of pixels may be connected to the row driver 120 through a plurality of row lines extending in the row direction. The plurality of pixels may be connected to the CDS 130 through a plurality of column lines extending in the column direction. The pixel array 200 may include at least one pixel group 300 arranged in the row direction and the column direction, and the pixel group 300 may include a plurality of pixels.

For example, the pixel array 200 may be arranged in a two-dimensional (2D) pixel array including rows and columns which has a plurality of unit pixels. As another example, the pixel array 200 may include rows and columns, and may be a three-dimensional (3D) pixel array whose pixels are arranged in a 3D shape including a third direction different from the row direction and the column direction.

A plurality of pixels included in the pixel array 200 may convert an optical signal into an electrical signal in units of pixels, in units of subpixels included in each pixel, and/or in units of a pixel group having the pixels, and the pixels included in the pixel group may share a specific internal pixel circuit.

The pixel array 200 may receive a pixel control signal including a row selection signal, a pixel reset signal, a row transfer signal, etc. from the row driver 120. At least one pixel included in the row that is selected by the row driver 120 according to the pixel control signal may perform a specific operation in response to the row selection signal, the pixel reset signal, and the row transfer signal.

The CDS 130 may receive the reference signal and the image signal, each of which corresponds to the columns of the pixel array 200, and may sample levels of the reference signal and the image signal. In the image sensing device designed to use CMOS(s), the CDS 130 may sample a pixel signal twice to remove a difference between these two samples, and may perform correlated double sampling to remove undesired offset values of pixels such as fixed noise. For example, the CDS 130 may compare pixel output voltages obtained before and after photocharges generated by incident light are accumulated in the floating diffusion region to remove undesired offset values, so that the pixel output voltages based on the incident light can be measured.

The CDS 130 may transmit reference signals and image signals, which are generated in columns based on a timing signal and a control signal of the timing controller 110, to the ADC 140 as CDS signals.

The ADC 140 may convert analog CDS signals received from the CDS 130 into digital signals, and may output the resultant digital signals.

The output buffer 150 may temporarily hold and output digital signals provided from the ADC 140.

The column driver 160 may select columns from the output buffer 150 based on a timing signal and a control signal of the timing controller 110, and may control the temporarily held digital signals to be output according to the selection order.

FIG. 2 is a schematic diagram illustrating an example of a portion of a pixel array 200 shown in FIG. 1 based on some implementations of the disclosed technology.

Referring to FIG. 2, the pixel array 200A may correspond to a portion of the pixel array 200 shown in FIG. 1. The pixel array 200A may include one or more pixel groups 300 disposed adjacent to each other.

In one implementation, the pixel group 300 may include four pixels. The four pixels may be arranged in a (2×2) matrix including two rows and two columns. Each of the four pixels may include four subpixels, and the four subpixels may be arranged in a (2×2) matrix including two rows and two columns. For example, a first light subpixel (LSP1), a second light subpixel (LSP2), a third light subpixel (LSP3), and a first storage subpixel SSP1 may be arranged in a (2×2) matrix to form one pixel.

The pixel group 300 may include a total of 16 subpixels. The 16 subpixels included in the pixel group 300 may include 12 light subpixels (LSPs) and 4 storage subpixels (SSPs), and the 4 storage subpixels (SSPs) may be disposed adjacent to each other, and may be arranged in a (2×2) matrix.

The four subpixels constituting one pixel may include three light subpixels (LSPs) and one storage subpixel (SSP). For example, the first to third light subpixels (LSP1, LSP2, LSP3) and the first storage subpixel SSP1 may be arranged in a (2×2) matrix to form one pixel.

The first light subpixel LSP1 may correspond to incident light having a first color, the second light subpixel LSP2 may correspond to incident light having a second color, and the third light subpixel LSP3 may correspond to incident light having a third color. In some implementations, the first to third colors may be different from one another. For example, the first color may be green, the second color may be red, and the third color may be blue. The colors of the first to third colors can be varied in various implementations. In another example, all of the first to third colors may be the same color (e.g., green).

All of the first to third colors are the same color, for example, the green light, and incident light of the first to third light subpixels (LSP1, LSP2, LSP3) may be green light. The first light subpixel LSP1 may be adjacent to the second light subpixel LSP2 in the column direction. The signal output from the first light subpixel LSP1 and the signal output from the second light subpixel LSP2 may be used to output pixel values of the first and second light subpixels (LSP1, LSP2), and may be used to adjust a focus of an image (e.g., up/down (vertical) focusing through comparison of phase differences between upper and lower incident lights). The first light subpixel LSP1 may be adjacent to the third light subpixel LSP3 in the row direction. The signal output from the first light subpixel LSP1 and the signal output from the third light subpixel LSP3 may be used to output pixel values of the first and third light subpixels (LSP1, LSP3), and may be used to adjust a focus of an image (e.g., left/right (horizontal) focusing through comparison of phase differences between left and right incident lights).

Figure 3A:
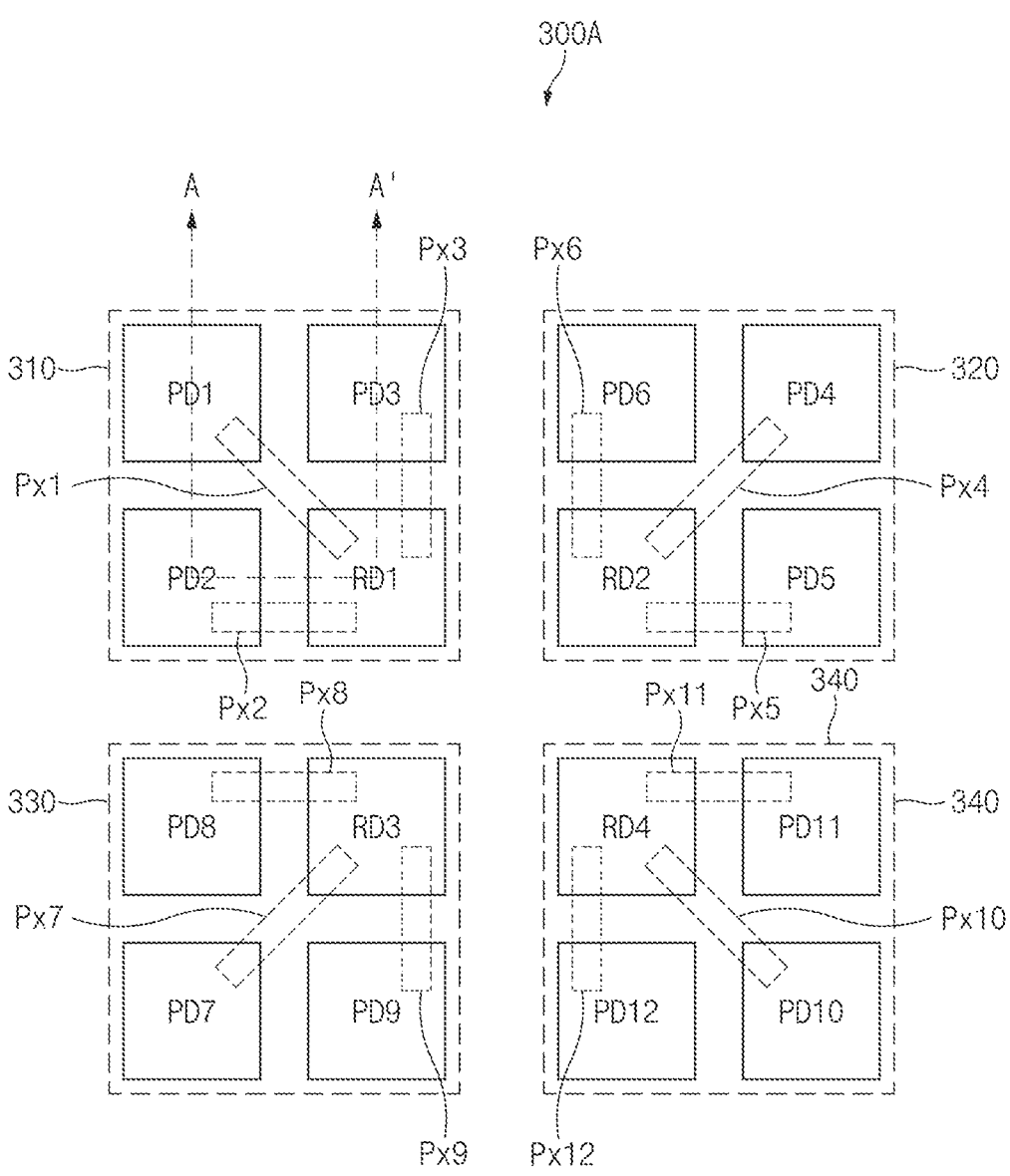
FIG. 3A is a schematic diagram illustrating an example of some common structures of a pixel group shown in FIG. 2 based on some implementations of the disclosed technology.

FIG. 3A is a schematic diagram illustrating an example of some common structures of the pixel group 300 shown in FIG. 2 based on some implementations of the disclosed technology.

Figure 3B:
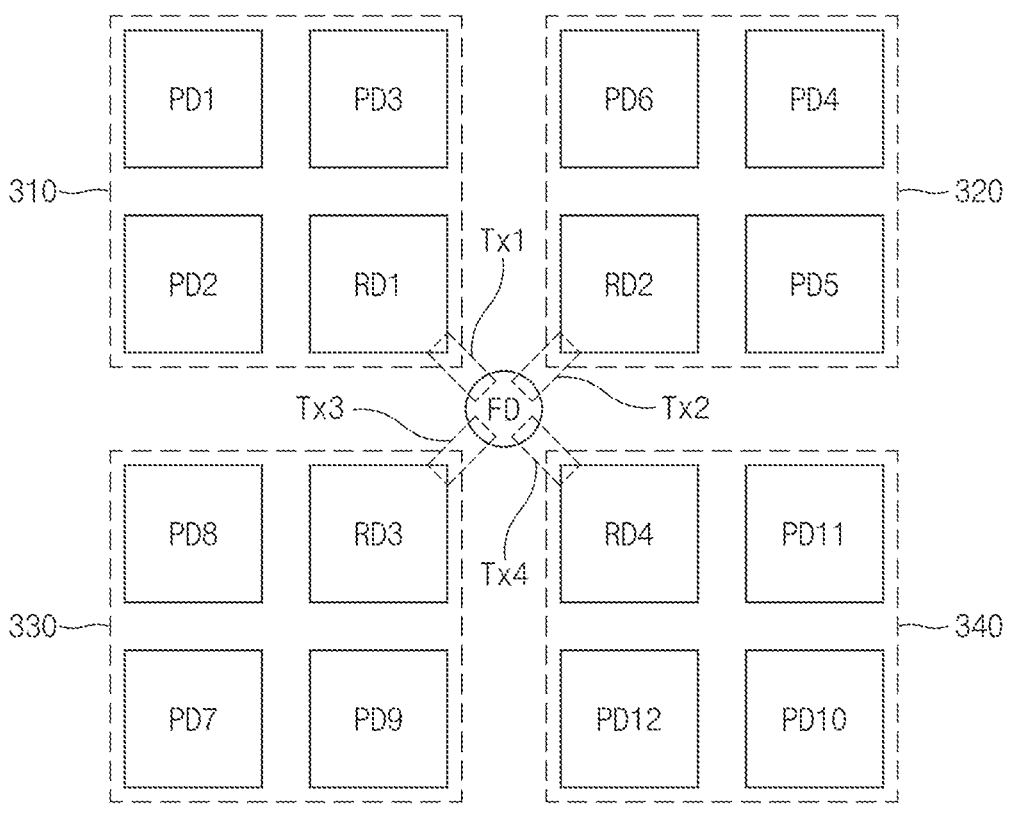
FIG. 3B is a schematic diagram illustrating an example of a partial structure of the pixel group shown in FIG. 2 based on some implementations of the disclosed technology.
Figure 3C:
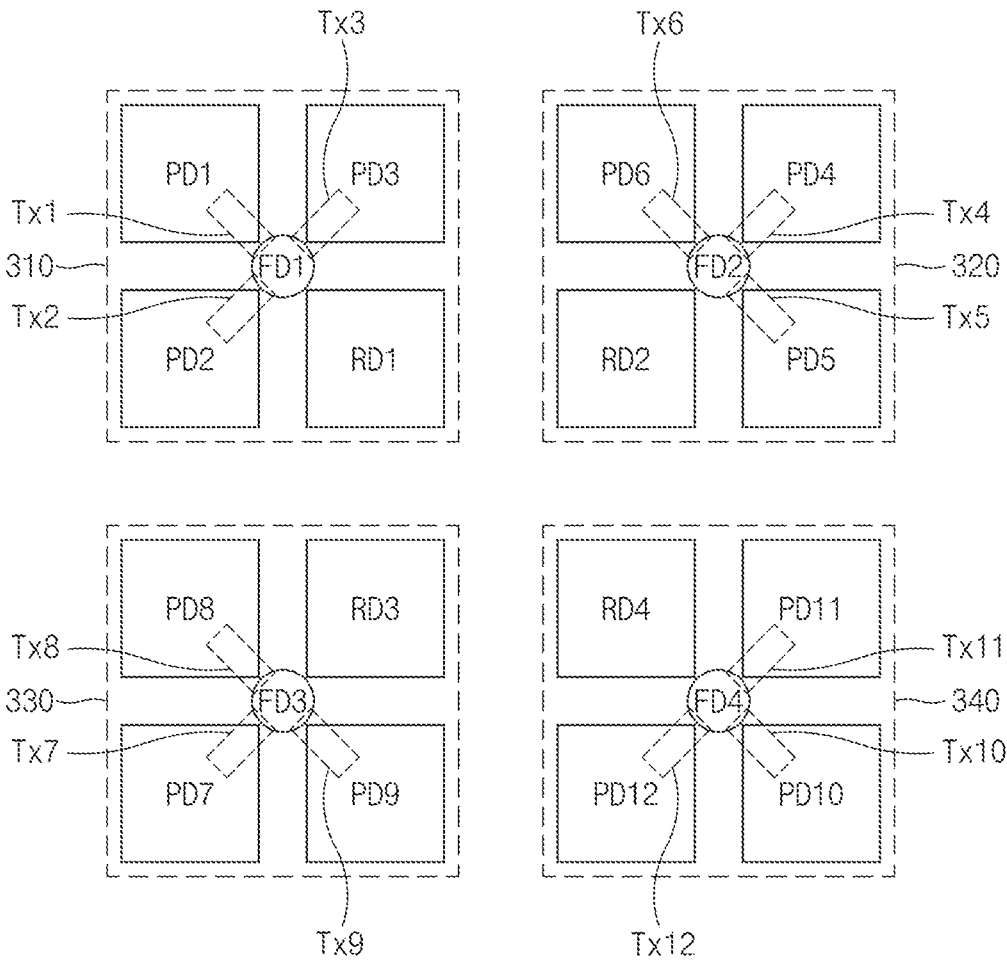
FIG. 3C is a schematic diagram illustrating another example of a partial structure of the pixel group shown in FIG. 2 based on some implementations of the disclosed technology.

FIG. 3B is a schematic diagram illustrating an example of a partial structure of the pixel group shown in FIG. 2 based on some implementations of the disclosed technology. FIG. 3C is a schematic diagram illustrating another example of a partial structure of the pixel group shown in FIG. 2 based on some implementations of the disclosed technology.

Each of the transistors (TX1~TX12, PX1~PX12) denoted by dotted lines shown in FIGS. 3A to 3C may indicate a gate of each of the transistors (TX1~TX12, PX1~PX12).

Referring to FIG. 3A, a pixel group 300A may correspond to the pixel group 300 of FIG. 2, and FIG. 3A is a schematic diagram illustrating internal structures of the pixel group 300A centered on some elements (e.g., a plurality of path transistors) included in the pixel group 300A. The cutting line A-A' shown in FIG. 3A may be the same as the cutting line A-A' line shown in FIG. 2. In FIGS. 3B and 3C, the cutting line A-A' is not shown to avoid redundancy.

In one implementation (hereinafter referred to as Embodiment 1) of the disclosed technology, as can be seen from FIGS. 2, 3A, and 3B, the pixel group 300A may include a first pixel 310, a second pixel 320, a third pixel 330, a fourth pixel 340, and a floating diffusion (FD) region electrically connected to each of the first to fourth pixels (310, 320, 330, 340).

The first pixel 310 may include a first photoelectric conversion element PD1, a second photoelectric conversion element PD2, a third photoelectric conversion element PD3, and a first storage element RD1. Each of the first to third photoelectric conversion elements (PD1, PD2, PD3) and the first storage element RD1 may be connected to each other by the first to third path transistors (PX1~PX3). The first storage element RD1 and the floating diffusion (FD) region may be connected to each other by the first transfer transistor TX1.

The first to third photoelectric conversion elements (PD1, PD2, PD3) may be included in the first to third light subpixels (LSP1, LSP2, LSP3) shown in FIG. 2, respectively. The first storage element RD1 may be included in the first storage subpixel SSP1 shown in FIG. 2. One pixel including the first to third light subpixels (LSP1, LSP2, LSP3) and the first storage subpixel SSP1 shown in FIG. 2 may correspond to the first pixel 310 shown in FIGS. 3A and 3B.

The second pixel 320 may include a fourth photoelectric conversion element PD4, a fifth photoelectric conversion element PD5, a sixth photoelectric conversion element PD6, and a second storage element RD2. Each of the fourth to sixth photoelectric conversion elements (PD4, PD5, PD6) and the second storage element RD2 may be connected to each other by the fourth to sixth path transistors (PX4~PX6). The second storage element RD2 and the floating diffusion (FD) region may be connected to each other by the second transfer transistor TX2.

The fourth to sixth photoelectric conversion elements (PD4, PD5, PD6) may be included in the fourth to sixth light subpixels (LSP4, LSP5, LSP6) shown in FIG. 2, respectively. The second storage element RD2 may be included in the second storage subpixel SSP2 shown in FIG. 2. One pixel including the fourth to sixth light subpixels (LSP4, LSP5, LSP6) and the second storage subpixel SSP2 shown in FIG. 2 may correspond to the second pixel 320 shown in FIGS. 3A and 3B.

The third pixel 330 may include a seventh photoelectric conversion element PD7, an eighth photoelectric conversion element PD8, a ninth photoelectric conversion element PD9, and a third storage element RD3. Each of the seventh to ninth photoelectric conversion elements (PD7, PD8, PD9) and the third storage element RD3 may be connected to each other by seventh to ninth path transistors (PX7~PX9). The third storage element RD3 and the floating diffusion (FD) region may be connected to each other by the third transfer transistor TX3.

The seventh to ninth photoelectric conversion elements (PD7, PD8, PD9) may be included in the seventh to ninth light subpixels (LSP7, LSP8, LSP9) shown in FIG. 2, respectively. The third storage element RD3 may be included in the third storage subpixel SSP3 shown in FIG. 2. One pixel including the seventh to ninth light subpixels (LSP7, LSP8, LSP9) and the third storage subpixel SSP3 shown in FIG. 2 may correspond to the third pixel 330 shown in FIGS. 3A and 3B.

The fourth pixel 340 may include a tenth photoelectric conversion element PD10, an eleventh photoelectric conversion element PD11, a twelfth photoelectric conversion element PD12, and a fourth storage element RD4. Each of the tenth to twelfth photoelectric conversion elements (PD10, PD11, PD12) and the fourth storage element RD4 may be connected to each other by the tenth to twelfth path transistors (PX10~PX12). The fourth storage element RD4 and the floating diffusion (FD) region may be connected to each other by the fourth transfer transistor TX4.

The tenth to twelfth photoelectric conversion elements (PD10, PD11, PD12) may be included in the tenth to twelfth light subpixels (LSP10, LSP11, LSP12) shown in FIG. 2, respectively. The fourth storage element RD4 may be included in the fourth storage subpixel SSP4 shown in FIG. 2. One pixel including the tenth to twelfth light subpixels (LSP10, LSP11, LSP12) and the fourth storage subpixel SSP4 shown in FIG. 2 may correspond to the fourth pixel 340 shown in FIGS. 3A and 3B.

The first to twelfth photoelectric conversion elements (PD1~PD12) may generate and accumulate photocharges in response to incident light. The photocharges generated by the first to twelfth photoelectric conversion elements (PD1~PD12) may move to the first to fourth storage elements (RD1~RD4) through the first to twelfth path transistors (PX1~PX12) respectively connected to the first to fourth storage elements (RD1~RD4). For example, when photocharges are excessively generated and overflow in the first photoelectric conversion element PD1, the first path transistor PX1 may move the overflown photocharges to the first storage element RD1. The content of the above example may be substantially equally applied to the second to twelfth path transistors (PX2~PX12).

Each of the first to fourth storage elements (RD1~RD4) may store photocharges moved by the first to twelfth path transistors (PX1~PX12) from the first to twelfth photoelectric conversion elements (PD1~PD12). Each of the first to fourth transfer transistors (TX1~TX4) may transfer the photocharges stored in the first to fourth storage elements (RD1~RD4) to the floating diffusion (FD) region.

The first to twelfth light subpixels (LSP1~LSP12) and the first to fourth storage subpixels (SSP1~SSP4) included in the first to fourth pixels (310, 320, 330, 340) may include optical filters (not shown in FIGS. 2, 3A, 3B, and 3C) configured to transmit light of a specific range of colors, respectively.

In the first to fourth pixels (310, 320, 330, 340) shown in Embodiment 1 of the disclosed technology, the subpixels (LSP1, LSP2, LSP3, SSP1) included in the first pixel 310 may include optical filters configured to transmit light of a first color, respectively, the subpixels (LSP4, LSP5, LSP6, SSP2) included in the second pixel 320 may include optical filters configured to transmit light of a second color, respectively, and the subpixels (LSP7, LSP8, LSP9, SSP3) included in the third pixel 330 may include optical filters configured to transmit light of a third color, respectively. The subpixels (LSP10, LSP11, LSP12, SSP4) included in the fourth pixel 340 may include optical filter configured to transmit light of a first color, respectively.

In the first to third color lights of Embodiment 1, for example, light of the first color (hereinafter referred to as 'first color light') may be green light, light of the second color (hereinafter referred to as 'second color light') may be red light, and light of the third color (hereinafter referred to as 'third color light') may be blue light. In another example, the first color light may be yellow light, the second color light may be cyan light, and the third color light may be magenta light.

Embodiment 1 is the example only and other implementations are also possible without being limited to Embodiment 1. In some implementations, in the first pixel 310, the first light subpixel LSP1 may include an optical filter configured to transmit light of a first color, the second light subpixel LSP2 may include an optical filter configured to transmit light of a second color, and the third light subpixel LSP3 may include an optical filter configured to transmit light of a third color.

In some implementations, the first color light may be green light, the second color light may be red light, and the third color light may be blue light. In some implementations, the first color light may be yellow light, the second color light may be cyan light, and the third color light may be magenta light.

Referring to FIGS. 2, 3A, and 3C showing another embodiment (hereinafter referred to as Embodiment 2) of the disclosed technology, the pixel group 300A may include a first pixel 310, a second pixel 320, a third pixel 330, and a fourth pixel 340. The first to fourth pixels (310, 320, 330, 340) may include the first to fourth floating diffusion regions (FD1~FD4), respectively. The first to fourth pixels (310, 320, 330, 340) may include the first to twelfth transfer transistors (TX1~TX12) that can be connected between the first to fourth floating diffusion regions (FD1~FD4) and the first to twelfth photoelectric conversion elements (PD1~PD12). In more detail, the first pixel 310 may include the first floating diffusion region FD1 and the first to third transfer transistors (TX1~TX3) connected to the first to third photoelectric conversion elements (PD1~PD3), the second pixel 320 may include the second floating diffusion region FD2 and the fourth to sixth transfer transistors (TX4~TX6) connected to the fourth to sixth photoelectric conversion elements (PD4~PD6), the third pixel 330 may include the third floating diffusion region FD3 and the seventh to ninth transfer transistors (TX7~TX9) connected to the seventh to ninth photoelectric conversion elements (PD7~PD9), and the fourth pixel 340 may include the fourth floating diffusion region FD4 and the tenth to twelfth transfer transistors (TX10~TX12) connected to the tenth to twelfth photoelectric conversion elements (PD10~PD12).

In some implementations, the first pixel 310 may include the first photoelectric conversion element PD1, the second photoelectric conversion element PD2, the third photoelectric conversion element PD3, and the first storage element RD1. Each of the first to third photoelectric conversion elements (PD1, PD2, PD3) and the first storage element RD1 may be connected to each other by the first to third path transistors (PX1~PX3), respectively. The first photoelectric conversion element PD1 and the first storage element RD1 may be connected to each other by the first path transistor PX1, the second photoelectric conversion element PD2 and the first storage element RD1 may be connected to each other by the second path transistor PX2, and the third photoelectric conversion element PD3 and the first storage element RD1 may be connected to each other by the third path transistor PX3. Each of the first to third photoelectric conversion elements (PD1, PD2, PD3) and the first floating diffusion region FD1 may be connected to each other by the first to third transfer transistors (TX1~TX3), respectively. For example, the first photoelectric conversion element PD1 and the first floating diffusion region FD1 may be connected to each other by the first transfer transistor TX1, the second photoelectric conversion element PD2 and the first floating diffusion region FD1 may be connected to each other by the second transfer transistor TX2, and the third photoelectric conversion element PD3 and the first floating diffusion region FD1 may be connected to each other by the third transfer transistor TX3.

The first to third photoelectric conversion elements (PD1, PD2, PD3) may be included in the first to third light subpixels (LSP1, LSP2, LSP3) shown in FIG. 2, respectively, and the first storage element RD1 may be included in the first storage subpixel SSP1 shown in FIG. 2. In FIG. 2, one pixel including the first to third light subpixels (LSP1, LSP2, LSP3) and the first storage subpixel SSP1 may correspond to the first pixel 310 shown in FIGS. 3A and 3C.

The second pixel 320 may include the fourth photoelectric conversion element PD4, the fifth photoelectric conversion element PD5, the sixth photoelectric conversion element PD6, and the second storage element RD2. The fourth to sixth photoelectric conversion elements (PD4, PD5, PD6) and the second storage element RD2 may be connected to each other by the fourth to sixth path transistors (PX4~PX6), respectively. Each of the fourth to sixth photoelectric conversion elements (PD4, PD5, PD6) and the second floating diffusion region FD2 may be connected to each other by the fourth to sixth transfer transistors (TX4~TX6), respectively.

The fourth to sixth photoelectric conversion elements (PD4, PD5, PD6) may be included in the fourth to sixth light subpixels (LSP4, LSP5, LSP6) shown in FIG. 2, respectively, and the second storage element RD2 may be included in the second storage subpixel SSP2 shown in FIG. 2. In FIG. 2, one pixel including the fourth to sixth light subpixels (LSP4, LSP5, LSP6) and the second storage subpixel SSP2 may correspond to the second pixel 320 shown in FIGS. 3A and 3C.

The third pixel 330 may include the seventh photoelectric conversion element PD7, the eighth photoelectric conversion element PD8, the ninth photoelectric conversion element PD9, and the third storage element RD3. The seventh to ninth photoelectric conversion elements (PD7, PD8, PD9) and the third storage element RD3 may be connected to each other by the seventh to ninth path transistors (PX7~PX9), respectively. Each of the seventh to ninth photoelectric conversion elements (PD7, PD8, PD9) and the third floating diffusion region FD3 may be connected to each other by the seventh to ninth transfer transistors (TX7~TX9), respectively.

The seventh to ninth photoelectric conversion elements (PD7, PD8, PD9) may be included in the seventh to ninth light subpixels (LSP7, LSP8, LSP9) shown in FIG. 2, respectively, and the third storage element RD3 may be included in the third storage subpixel SSP3 shown in FIG. 2. In FIG. 2, one pixel including the seventh to ninth light subpixels (LSP7, LSP8, LSP9) and the third storage subpixel SSP3 may correspond to the third pixel 330 shown in FIGS. 3A and 3C.

The fourth pixel 340 may include the tenth photoelectric conversion element PD10, the eleventh photoelectric conversion element PD11, the twelfth photoelectric conversion element PD12, and the fourth storage element RD4. The tenth to twelfth photoelectric conversion elements (PD10, PD11, PD12) and the fourth storage element RD4 may be connected to each other by the tenth to twelfth path transistors (PX10~PX12), respectively. Each of the tenth to twelfth photoelectric conversion elements (PD10, PD11, PD12) and the fourth floating diffusion region FD4 may be connected to each other by the tenth to twelfth transfer transistors (TX10~TX12), respectively.

The tenth to twelfth photoelectric conversion elements (PD10, PD11, PD12) may be included in the tenth to twelfth light subpixels (LSP10, LSP11, LSP12) shown in FIG. 2, respectively, and the fourth storage element RD4 may be included in the fourth storage subpixel SSP4 shown in FIG. 2. In FIG. 2, one pixel including the tenth to twelfth light subpixels (LSP10, LSP11, LSP12) and the fourth storage subpixel SSP4 may correspond to the fourth pixel 340 shown in FIGS. 3A and 3C.

The first to twelfth photoelectric conversion elements (PD1~PD12) may generate and accumulate photocharges in response to incident light. The photocharges generated by the first to twelfth photoelectric conversion elements (PD1~PD12) may be stored while being distributed into the first to twelfth photoelectric conversion elements (PD1~PD12) and/or the first to fourth storage elements (RD1~RD4) by the first to twelfth path transistors (PX1~PX12) connected to the first to fourth storage elements (RD1~RD4). In addition, each of the first to twelfth path transistors (PX1~PX12) may transfer photocharges stored in the first to fourth storage elements (RD1~RD4) to the first to twelfth photoelectric conversion elements (PD1~PD12). For example, when photocharges overflow in the first photoelectric conversion element PD1, the overflown photocharges may move to the first storage element RD1 by the first path transistor PX1 and stored therein, and the photocharges stored in the first storage element RD1 may move to the first photoelectric conversion element PD1 again. In Embodiment 2 of the disclosed technology, the above example related to the first path transistor PX1 may be substantially equally applied to the second to twelfth path transistors (PX2~PX12).

The first to twelfth transfer transistors (TX1~TX12) shown in Embodiment 2 of the disclosed technology may transfer photocharges present in the first to twelfth photoelectric conversion elements (PD1~PD12) to the first to fourth floating diffusion regions (FD1~FD4), respectively. The first to third transfer transistors (TX1~TX3) may transfer photocharges present in the first to third photoelectric conversion elements (PD1~PD3) to the first floating diffusion region FD1, the fourth to sixth transfer transistors (TX4~TX6) may transfer photocharges present in the fourth to sixth photoelectric conversion elements (PD4~PD6) to the second floating diffusion region FD2, the seventh to ninth transfer transistors (TX7~TX9) may transfer photocharges present in the seventh to ninth photoelectric conversion elements (PD7~PD9) to the third floating diffusion region FD3, and the tenth to twelfth transfer transistors (TX10~TX12) may transfer photocharges present in the tenth to twelfth photoelectric conversion elements (PD10~PD12) to the fourth floating diffusion region FD4. The first to twelfth photoelectric conversion elements (PD1~PD12) may include photocharges having moved from the first to fourth storage elements (RD1~RD4) by the first to twelfth path transistors (PX1~PX12), respectively. In more detail, the first photoelectric conversion element PD1 may include photocharges having moved from the first storage element RD1 by the first path transistor PX1, the second photoelectric conversion element PD2 may include photocharges having moved from the first storage element RD1 by the second path transistor PX2, and the third photoelectric conversion element PD3 may include photocharges having moved from the first storage element RD1 by the third path transistor PX3. The fourth photoelectric conversion element PD4 may include photocharges having moved from the second storage element RD2 by the fourth path transistor PX4, the fifth photoelectric conversion element PD5 may include photocharges having moved from the second storage element RD2 by the fifth path transistor PX5, and the sixth photoelectric conversion element PD6 may include photocharges having moved from the second storage element RD2 by the sixth path transistor PX6. The seventh photoelectric conversion element PD7 may include photocharges having moved from the third storage element RD3 by the seventh path transistor PX7, the eighth photoelectric conversion element PD8 may include photocharges having moved from the third storage element RD3 by the eighth path transistor PX8, and the ninth photoelectric conversion element PD9 may include photocharges having moved from the third storage element RD3 by the ninth path transistor PX9. Further, the tenth photoelectric conversion element PD10 may include photocharges having moved from the fourth storage element RD4 by the tenth path transistor PX10, the eleventh photoelectric conversion element PD11 may include photocharges having moved from the fourth storage element RD4 by the eleventh path transistor PX11, and the twelfth photoelectric conversion element PD12 may include photocharges having moved from the fourth storage element RD4 by the twelfth path transistor PX12.

Each of the first to twelfth light subpixels (LSP1~LSP12) and the first to fourth storage subpixels (SSP1~SSP4) included in the first to fourth pixels (310, 320, 330, 340) may include an optical filter (not shown in FIGS. 2, 3A, 3B, and 3C) configured to transmit light of a specific range of colors.

Each of the first to fourth pixels (310, 320, 330, 340) shown in Embodiment 2 of the disclosed technology may include optical filters configured to transmit light of a first color, respectively. Each of the subpixels (LSP4, LSP5, LSP6, SSP2) included in the second pixel 320 may include optical filters configured to transmit light of a second color, respectively. Each of the subpixels (LSP7, LSP8, LSP9, SSP3) included in the third pixel 330 may include optical filters configured to transmit light of a third color, respectively. Each of the subpixels (LSP10, LSP11, LSP12, SSP4) included in the fourth pixel 340 may include optical filters configured to transmit light of the first color, respectively.

In association with the first to third color lights shown in Embodiment 2 of the disclosed technology, for example, the first color light may be green light, the second color light may be red light, and the third color light may be blue light.

As another example, the first color light may be yellow light, the second color light may be cyan light, and the third color light may be magenta light.

The scope of the disclosed technology cannot be construed as being limited to the above embodiment. Alternatively, according to another embodiment, in the first pixel 310, the first light subpixel LSP1 may include an optical filter configured to transmit the first color light, the second light subpixel LSP2 may include an optical filter configured to transmit the second color light, and the third light subpixel LSP3 may include an optical filter configured to transmit the third color light.

In the first to third color lights of another embodiment, for example, the first color light may be green light, the second color light may be red light, and the third color light may be blue light. As another example, the first color light may be yellow light, the second color light may be cyan light, and the third color light may be magenta light.

Figure 4:
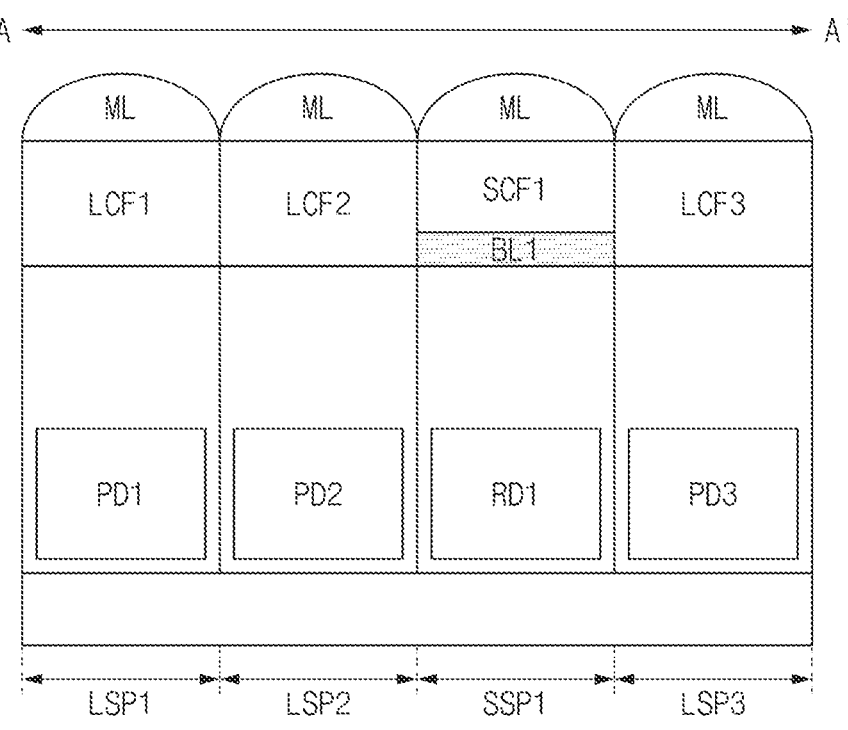
FIG. 4 is a cross-sectional view illustrating an example of the pixel array taken along the line A-A' shown in FIG. 2 based on some implementations of the disclosed technology.

FIG. 4 is a cross-sectional view illustrating an example of the pixel array taken along the line A-A' shown in FIG. 2 based on some implementations of the disclosed technology.

Referring to FIGS. 2, 3A and 4, the line A-A' may correspond to a line that sequentially passes through the first light subpixel LSP1, the second light subpixel LSP2, the first storage subpixel SSP1, and the third light subpixel LSP3 included in the first pixel 310.

The first light subpixel LSP1 may include the first photoelectric conversion element PD1 disposed on a substrate, and a first light color filter LCF1 configured to transmit light of a specific range of colors may be disposed on the substrate. A microlens (ML) configured to collect (or converge) incident light may be disposed on the first light color filter LCF1.

The second light subpixel LSP2 may include the second photoelectric conversion element PD2 disposed on the substrate, and a second light color filter LCF2 configured to transmit light of a specific range of colors may be disposed on the substrate. A microlens (ML) configured to collect (or converge) incident light may be disposed on the second light color filter LCF2.

The first storage subpixel SSP1 may include a first storage element RD1 disposed on the substrate, and a first light blocking structure BL1 may be disposed on the substrate. A first storage color filter SCF1 may be disposed on the first light blocking structure BL1 to transmit light of a specific range of colors. A microlens (ML) configured to collect (or converge) incident light may be disposed on the first storage color filter SCF1. The first light blocking structure BL1 may prevent transmission of incident light so that the first storage element RD1 included in the first storage subpixel SSP1 can prevent photocharges from being generated in response to the amount of incident light. Due to prevention of generation of such photocharges, the first storage element RD1 included in the first storage subpixel SSP1 does not generate photocharges, and stores at least a portion of photocharges generated by the first to third light subpixels (LSP1, LSP2, LSP3). The position of the first light blocking structure BL1 is not limited to being located under the first storage color filter SCF1, and as long as the first light blocking structure BL1 has a position and structure capable of blocking light from entering the first storage element RD1 included in the first storage subpixel SSP1, it will be appreciated that the first light blocking structure BL1 is within the scope of the disclosed technology.

The third light subpixel LSP3 may include the third photoelectric conversion element PD3 disposed on a substrate, and a third light color filter LCF3 configured to transmit light of a specific range of colors may be disposed on the substrate. A microlens (ML) configured to collect (or converge) incident light may be disposed on the third light color filter LCF3.

The first storage color filter SCF1 may be substantially identical to at least one of the first to third light color filters (LCF1~LCF3). As another example, the first storage color filter SCF1 may have a stacked structure in which at least two different color filters from among the first to third light color filters are stacked. The first light blocking structure BL1 may have, for example, a structure of a film (or layer) including metal. It will be appreciated that the combination of the first light blocking structure BL1 and the first storage color filter SCF1 may be within the scope of the disclosed technology as long as a person skilled in the art can implement the above structure capable of blocking incident light from entering the first storage element RD1.

In one embodiment of the disclosed technology, the first light color filter LCF1 may transmit light of a first color, the second light color filter LCF2 may transmit light of a second color, and the third light color filter LCF3 may transmit light of a third color. For example, the first color may be green, the second color may be red, and the third color may be blue. In another example, the first color may be yellow, the second color may be cyan, and the third color may be magenta. In still another example, all of the first to third colors may be the same color (e.g., green).

The content described with respect to FIG. 4 can be substantially equally applied to the second to fourth pixels (320, 330, 340). For example, in the fourth to sixth light subpixels (LSP4, LSP5, LSP6) and the second storage subpixel SSP2 included in the second pixel 320, the fourth light subpixel LSP4 may include a fourth photoelectric conversion element (PD4) disposed on a substrate, a fourth light color filter configured to transmit light of a specific range of colors may be disposed on the substrate, and a microlens (ML) configured to collect (or converge) incident light may be disposed on the fourth light color filter. The light subpixels (LSP1~LSP12) and the storage subpixels (SSP1~SSP4) based on some implementations of the disclosed technology may further include additional constituent components as needed.

Figure 5A:
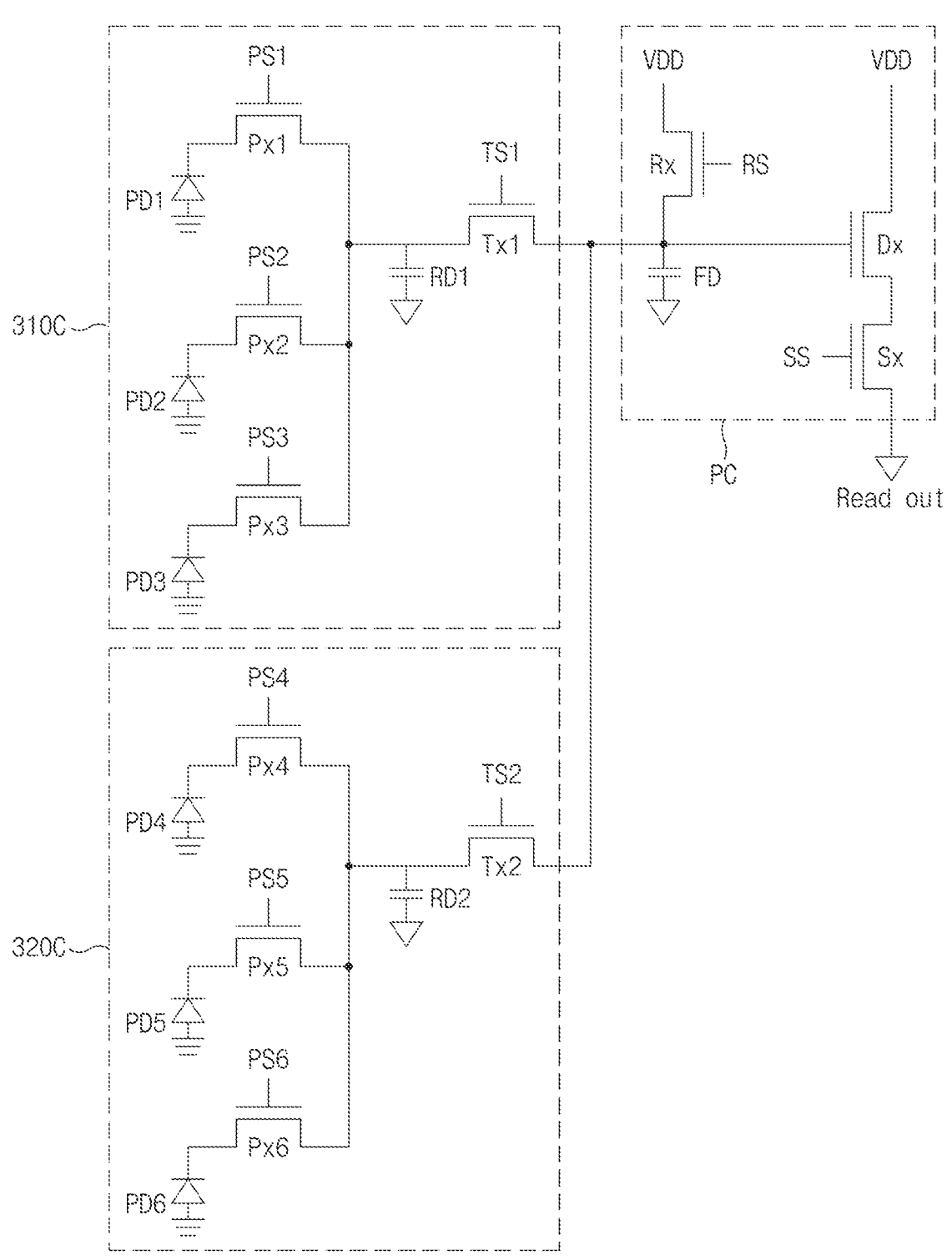
FIG. 5A is a circuit diagram illustrating an example of a portion of the pixel group shown in FIG. 2 based on some implementations of the disclosed technology.
Figure 5B:
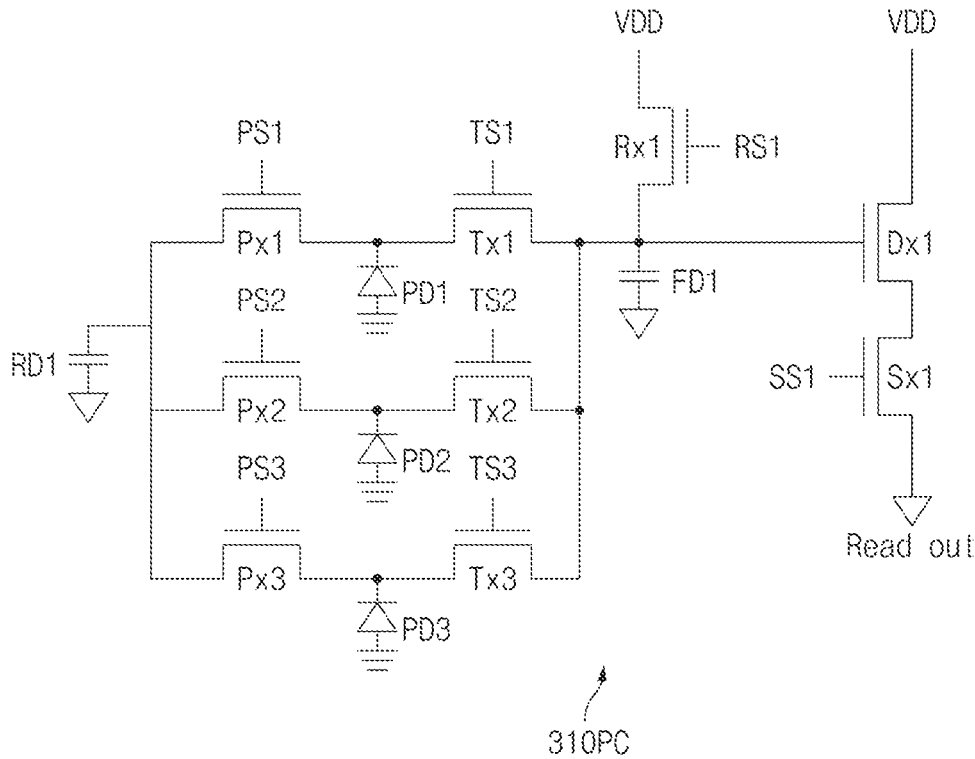
FIG. 5B is a circuit diagram illustrating another example of a portion of the pixel group shown in FIG. 2 based on some implementations of the disclosed technology.

FIGS. 5A and 5B are circuit diagrams illustrating examples of a portion of the pixel group shown in FIG. 2.

In detail, FIG. 5A is a circuit diagram illustrating one embodiment of a portion of the pixel group shown in FIG. 2.

FIG. 5B is a circuit diagram illustrating another example of a portion of the pixel group shown in FIG. 2 based on some implementations of the disclosed technology.

FIG. 5A is a circuit diagram illustrating an example of a portion of the pixel group shown in FIG. 2, and may correspond to a portion of the circuit of the first embodiment (Embodiment 1) shown in FIGS. 3A and 3B.

Referring to FIGS. 3A, 3B, and 5A, FIG. 5A illustrates an embodiment of a portion of the circuit of a pixel group (300A in FIG. 3A) including a first circuit 310C corresponding to the first pixel 310 and a second circuit 320C corresponding to the second pixel 320. Here, a circuit corresponding to the third pixel 330 and a circuit corresponding to the fourth pixel 340 may be substantially the same as the first circuit 310C and the second circuit 320C, respectively, so that the circuits can be included in the pixel group 300A. Only the first circuit 310C and the second circuit 320C will hereinafter be described for convenience of description, and description of the circuit corresponding to the third pixel 330 and the circuit corresponding to the fourth pixel 340 will herein be omitted.

The circuit of the pixel group 300A may include a first circuit 310C including constituent components included in the first pixel 310, a second circuit 320C including constituent components included in the second pixel 320, and an internal pixel circuit PC.

The first circuit 310C may include first to third photoelectric conversion elements (PD1~PD3), first to third path transistors (PX1~PX3), a first storage element RD1, and a first transfer transistor TX1. The first photoelectric conversion element PD1 and the first storage element RD1 may be connected to each other by the first path transistor PX1 that can respond to a first path selection signal PS1 upon receiving a gate voltage as an input. The second photoelectric conversion element PD2 and the first storage element RD1 may be connected to each other by the second path transistor PX2 that can respond to a second path selection signal PS2 upon receiving a gate voltage as an input. The third photoelectric conversion element PD3 and the first storage element RD1 may be connected to each other by the third path transistor PX3 that can respond to a third path selection signal PS3 upon receiving a gate voltage as an input. The first transfer transistor TX1 may be connected between the first storage element RD1 and the floating diffusion (FD) region.

Each of the first to third photoelectric conversion elements (PD1~PD3) may generate and accumulate charges corresponding to the amount of incident light by absorbing the incident light. Each of the first to third photoelectric conversion elements (PD1~PD3) may be implemented as a photodiode, a phototransistor, a photogate, or a combination thereof. As a representative example of the first to third photoelectric conversion elements (PD1~PD3), the photodiodes are exemplarily shown in FIG. 5A for convenience of description. When charges accumulated in each of the first to third photoelectric conversion elements (PD1~PD3) exceed the storage capacity of each photoelectric conversion element, resulting in overflow of photocharges during the absorption time of incident light, the overflown photocharges may move to the first storage element RD1 by the first to third path transistors (PX1~PX3).

When the first to third path transistors (PX1~PX3) are turned on or half-turned on in response to the first to third path selection signals (PS1~PS3) applied to gate terminals thereof, photocharges generated by the first to third photoelectric conversion elements (PD1~PD3) in response to incident light can be transferred to the first storage element RD1. As discussed later in this patent document, the first to third path transistors (PX1~PX3) are turned on in response to a path selection signal with a high level and half-turned on in response to the path selection signal with a medium level.

For example, when the first to third photoelectric conversion elements (PD1~PD3) generate photocharges in response to incident light, if the first to third photoelectric conversion elements (PD1~PD3) are half-turned on in response to the first to third path selection signals (PS1~PS3), overflown photocharges that correspond to an excess of the photocharges that are generated to exceed the storage capacities of the first to third photoelectric conversion elements (PD1~PD3) are transferred to the first storage element RD1, so that a blooming phenomenon can be prevented.

The first storage element RD1 may store photocharges generated by the first to third photoelectric conversion elements (PD1~PD3). For example, the first storage element RD1 may store overflown photocharges of the light subpixels adjacent to the first storage element RD1, which correspond to the first to third light subpixels (LSP1~LSP3 of FIG. 2). The first storage subpixel SSP1 stores overflown photocharges of the light subpixels (LSP1~LSP3 of FIG. 2) adjacent to the first storage element RD1, resulting in increased signal accuracy of the adjacent light subpixels (LSP1~LSP3 of FIG. 2).

The first transfer transistor TX1 may receive a voltage through a gate terminal thereof, and may respond to a row transfer signal TS1. The first transfer transistor TX1 may be turned on in response to the row transfer signal TS1, and may transfer photocharges stored in the first storage element RD1 to the floating diffusion (FD) region.

The second circuit 320C may include fourth to sixth photoelectric conversion elements (PD4~PD6), fourth to sixth path transistors (PX4~PX6), a second storage element RD2, and a second transfer transistor TX2. The fourth photoelectric conversion element PD4 and the second storage element RD2 may be connected to each other by the fourth path transistor PX4 that can respond to a fourth path selection signal PS4 upon receiving a gate voltage as an input. The fifth photoelectric conversion element PD5 and the second storage element RD2 may be connected to each other by the fifth path transistor PX5 that can respond to a fifth path selection signal PS5 upon receiving a gate voltage as an input. The sixth photoelectric conversion element PD6 and the second storage element RD2 may be connected to each other by the sixth path transistor PX6 that can respond to a sixth path selection signal PS6 upon receiving a gate voltage as an input. The second transfer transistor TX2 may be connected between the second storage element RD2 and the floating diffusion (FD) region.

Each of the fourth to sixth photoelectric conversion elements (PD4~PD6) may generate and accumulate charges corresponding to the amount of incident light by absorbing the incident light. Each of the fourth to sixth photoelectric conversion elements (PD4~PD6) may be implemented as a photodiode, a phototransistor, a photogate, or a combination thereof. As a representative example of the fourth to sixth photoelectric conversion elements (PD4~PD6), the photodiodes are exemplarily shown in FIG. 5A for convenience of description. When charges accumulated in each of the fourth to sixth photoelectric conversion elements (PD4~PD6) exceed the storage capacity of each photoelectric conversion element, resulting in overflow of photocharges during the absorption time of incident light, the overflown photocharges may move to the second storage element RD2 by the fourth to sixth path transistors (PX4~PX6).

When the fourth to sixth path transistors (PX4~PX6) are turned on or half-turned on in response to the fourth to sixth path selection signals (PS4~PS6) applied to gate terminals thereof, photocharges generated by the fourth to sixth photoelectric conversion elements (PD4~PD6) in response to incident light can be transferred to the second storage element RD2.

For example, even when the fourth to sixth photoelectric conversion elements (PD4~PD6) generate photocharges in response to incident light, the fourth to sixth photoelectric conversion elements (PD4~PD6) are turned on, so that overflown photocharges generated to exceed the storage capacities of the fourth to sixth photoelectric conversion elements (PD4~PD6) may be transferred to the second storage element RD2. In this way, the overflown photocharges are transferred to the second storage element RD2, thereby preventing a blooming phenomenon in advance.

The second storage element RD2 may store photocharges generated by the fourth to sixth photoelectric conversion elements (PD4~PD6). For example, the second storage element RD2 may store overflown photocharges of the fourth to sixth light subpixels (LSP4~LSP6 of FIG. 2) corresponding to adjacent light subpixels. The second storage subpixel SSP2 stores overflown photocharges of the light subpixels (LSP4~LSP6 of FIG. 2) adjacent to the second storage element RD2, resulting in increased signal accuracy of the adjacent light subpixels (LSP4~LSP6 of FIG. 2).

The second transfer transistor TX2 may receive a voltage through a gate terminal thereof, and may respond to a row transfer signal TS2. The second transfer transistor TX2 may be connected between the second storage element RD2 and the floating diffusion (FD) region. The second transfer transistor TX2 may be turned on in response to the row transfer signal TS2, and may transfer photocharges stored in the second storage element RD2 to the floating diffusion (FD) region.

The internal pixel circuit PC may include a floating diffusion (FD) region, a reset transistor RX, a drive transistor DX, and a selection transistor SX. The internal pixel circuit PC may be connected to circuits (e.g., 310C and 320C) corresponding to the first to fourth pixels (310, 320, 330, 340), so that the first to fourth pixels (310, 320, 330, 340) may share one internal pixel circuit PC.

The floating diffusion (FD) region may be a region for converting charges into a voltage. Since the floating diffusion (FD) region has a junction capacitor, the floating diffusion (FD) region can accumulate charges therein. More specifically, the floating diffusion (FD) region may be doped with impurities of a first conductivity type, and a semiconductor layer covering the floating diffusion (FD) region may be doped with impurities of a second conductivity type. Due to the relationship between the floating diffusion (FD) region and the semiconductor layer, the floating diffusion (FD) region may accumulate photocharges therein.

The reset transistor RX may be turned on according to a pixel reset signal RS applied to a gate terminal thereof, so that the reset transistor RX can reset the floating diffusion (FD) region to the power-supply voltage VDD.

The drive transistor DX shown as an example of a source follower amplifier may amplify a change in potential of the floating diffusion (FD) region, and may transmit the amplified signal to the selection transistor SX.

The selection transistor SX may serve to select subpixels to be read on a row basis. The selection transistor SX may be turned on according to the row selection signal SS applied to a gate terminal thereof, so that a signal corresponding to the potential change of the floating diffusion (FD) region may be output as a voltage.

FIG. 5B is a circuit diagram illustrating another example of a portion of the pixel group shown in FIG. 2 based on some implementations of the disclosed technology, and may correspond to a portion of the circuit of the second embodiment (Embodiment 2) shown in FIGS. 3A and 3C.

Referring to FIGS. 3A, 3C, and 5B, FIG. 5B illustrates an embodiment of a portion of the circuit of the pixel group (300A in FIG. 3A) including a first pixel circuit 310PC corresponding to the first pixel 310. Circuits corresponding to the second to fourth pixels (320, 330, 340) may be configured substantially the same as the first pixel circuit 310PC, so that these circuits can be included in the pixel group 300A. Only the first pixel circuit 310PC will hereinafter be described for convenience of description, and description of the circuits corresponding to the second to fourth pixels (320, 330, 340) will herein be omitted.

The circuit of the pixel group 300A may include a first pixel circuit 310PC including constituent elements included in the first pixel 310.

The first pixel circuit 310PC may include first to the third photoelectric conversion elements (PD1~PD3), the first to third path transistors (PX1~PX3), the first storage element RD1, and the first to third transfer transistors (TX1~TX3). The first photoelectric conversion element PD1 and the first storage element RD1 may be connected to each other by the first path transistor PX1 that can respond to a first path selection signal PS1 upon receiving a gate voltage as an input. The second photoelectric conversion element PD2 and the first storage element RD1 may be connected to each other by the second path transistor PX2 that can respond to a second path selection signal PS2 upon receiving a gate voltage as an input. The third photoelectric conversion element PD3 and the first storage element RD1 may be connected to each other by the third path transistor PX3 that can respond to a third path selection signal PS3 upon receiving a gate voltage as an input. The first photoelectric conversion element PD1 and the first floating diffusion region FD1 may be connected to each other by the first transfer transistor TX1 that can respond to a first row transfer signal TS1 upon receiving a gate voltage as an input. The second photoelectric conversion element PD2 and the first floating diffusion region FD1 may be connected to each other by the second transfer transistor TX2 that can respond to a second row transfer signal TS2 upon receiving a gate voltage as an input. The third photoelectric conversion element PD3 and the first floating diffusion region FD1 may be connected to each other by the third transfer transistor TX3 that can respond to a third row transfer signal TS3 upon receiving a gate voltage as an input.

Each of the first to third photoelectric conversion elements (PD1~PD3) may generate and accumulate charges corresponding to the amount of incident light by absorbing the incident light. Each of the first to third photoelectric conversion elements (PD1~PD3) may be implemented as a photodiode, a phototransistor, a photogate, or a combination thereof. As a representative example of the first to third photoelectric conversion elements (PD1~PD3), the photodiodes are exemplarily shown in FIG. 5B for convenience of description. When charges accumulated in each of the first to third photoelectric conversion elements (PD1~PD3) exceed the storage capacity of each photoelectric conversion element, resulting in overflow of photocharges during the absorption time of incident light, the overflown photocharges may move to the first storage element RD1 by the first to third path transistors (PX1~PX3).

When the first to third path transistors (PX1~PX3) are turned on or half-turned on in response to the first to third path selection signals (PS1~PS3) applied to gate terminals thereof, photocharges generated by the first to third photoelectric conversion elements (PD1~PD3) in response to incident light can be transferred to the first storage element RD1, or photocharges stored in the first storage element RD1 can be transferred to each of the first to third photoelectric conversion elements (PD1~PD3).

For example, when the first to third photoelectric conversion elements (PD1~PD3) generate photocharges in response to incident light, if the first to third photoelectric conversion elements (PD1~PD3) are half-turned on in response to the first to third path selection signals (PS1~PS3), overflown photocharges generated to exceed the storage capacities of the first to third photoelectric conversion elements (PD1~PD3), are transferred to the first storage element RD1. As the overflown photocharges are transferred to the first storage element RD1, a blooming phenomenon can be prevented.

The first storage element RD1 may store photocharges generated by the first to third photoelectric conversion elements (PD1~PD3). For example, the first storage element RD1 may store overflown photocharges of the first to third light subpixels (LSP1~LSP3 of FIG. 2) corresponding to adjacent light subpixels. The first storage subpixel SSP1 stores overflown photocharges of the light subpixels (LSP1~LSP3 of FIG. 2) adjacent to the first storage element RD1, resulting in increased signal accuracy of the adjacent light subpixels (LSP1~LSP3 of FIG. 2).

When the first to third transfer transistors (TX1~TX3) are turned on according to the first to third row transfer signals (TS1~TS3) applied to gate terminals thereof, photocharges existing in the first to third photoelectric conversion elements (PD1~PD3) may be transferred to the first floating diffusion region FD1.

For example, when the first to third photoelectric conversion elements (PD1~PD3) generate photocharges in response to incident light and the first to third path transistors (PX1~PX3) are half-turned on to transfer some of the generated photocharges to the first storage element RD1 in response to the first to third path selection signals (PS1~PS3) each having a medium level ('M' in FIG. 6), if the first to third path selection signals (PS1~PS3) each having a high level ('H' in FIG. 6) are supplied to the first to third path transistors (PX1~PX3) and the first to third row transfer signals (TS1~TS3) each having a high level ('H' in FIG. 6) are supplied to the first to third transfer transistors (TX1~TX3), photocharges stored in the first storage element RD1 can move back to the first to third photoelectric conversion elements (PD1~PD3), and photocharges present in the first to third photoelectric conversion elements (PD1~PD3) each having photocharges having moved from the first storage element RD1 can move to the first floating diffusion region FD1.

The charges in the floating diffusion region FD1 may be converted into a voltage signal. Since the floating diffusion region FD1 has a junction capacitor, the floating diffusion region FD1 can accumulate charges therein. In some implementations, the floating diffusion region FD1 may be doped with impurities of the first conductivity type, and a semiconductor layer covering the floating diffusion region FD1 may be doped with impurities of the second conductivity type. Due to the relationship between the floating diffusion region FD1 and the semiconductor layer, the floating diffusion region FD1 may accumulate photocharges therein.

The first reset transistor RX1 may be turned on according to a first pixel reset signal RS1 applied to a gate terminal thereof, so that the first reset transistor RX1 may reset the floating diffusion region FD1 to the power-supply voltage VDD.

The first drive transistor DX1 shown as an example of a source follower amplifier may amplify a change in potential of the first floating diffusion region FD1, and may transmit the amplified signal to the first selection transistor SX1.

The first selection transistor SX1 may serve to select subpixels to be read on a row basis. The first selection transistor SX1 may be turned on according to the first row selection signal SS1 applied to a gate terminal thereof, so that a signal corresponding to the potential change of the first floating diffusion region FD1 may be output as a voltage.

For the above-mentioned transistors of Embodiment 1 and Embodiment of the disclosed technology, signal levels of pixel control signals supplied to the respective transistors will be described below. This description will be also applied to other embodiments of the disclosed technology without being limited to Embodiment 1 and Embodiment 2.

Figure 6:
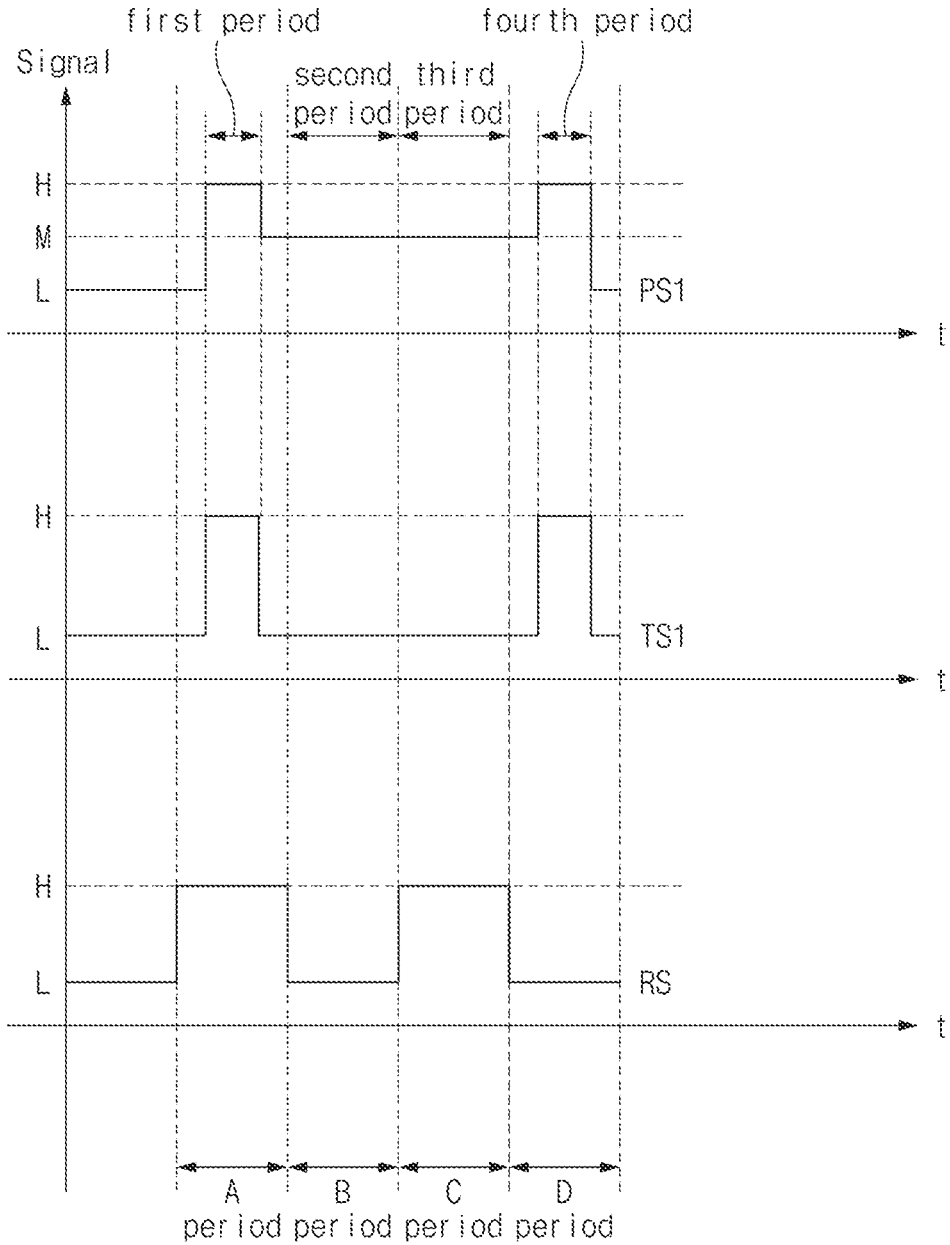
FIG. 6 is a timing diagram illustrating an example of timing points of pixel signals supplied to a portion of the circuit shown in FIGS. 5A and 5B.

FIG. 6 is a timing diagram illustrating an example of timing points of pixel signals supplied to a portion of the circuit shown in FIGS. 5A and 5B.

FIGS. 7A to 7D are distribution diagrams illustrating examples of potential distribution for each partial section of pixel signal timing points shown in FIG. 6, which may correspond to a timing diagram for an embodiment of the disclosed technology.

FIGS. 8A to 8D are distribution diagrams illustrating examples of potential distribution for each partial section of pixel signal timing points shown in FIG. 6, which may correspond to a timing diagram for another embodiment of the disclosed technology.

With reference to FIGS. 3A, 3B, 5A, 6, and 7A to 7D, various implementations can be provided, which includes the first embodiment (Embodiment 1). Hereinafter, for convenience of description, the pixel signal timing points and potential distribution for each section of the pixel signal timing of the first embodiment (Embodiment 1) will be described in detail.

Referring to FIGS. 3A, 3B, 5A, and 6, control signals (PS1~PS6, TS1~TS2, RS, SS) applied to the first pixel 310 and the second pixel 320 are shown in FIG. 5A. Based on the control signals, a portion of the pixel group 300A shown in FIGS. 3A and 3B can be controlled. Signals substantially the same as the first to sixth path selection signals (PS1~PS6) supplied to the first to sixth path transistors (PX1~PX6) may be supplied to the seventh to twelfth path transistors (PX7~PX12 in FIG. 3A), and signals substantially the same as the first to second row transfer signals (TS1~TS2) supplied to the first to second transfer transistors (TX1~TX2) may be supplied to the third to fourth transfer transistors (TX3~TX4 in FIG. 3B). Hereinafter, a description of the transistors (PX7~PX12, TX3~TX4), which are not shown in the first circuit 310C and the second circuit 320C shown in FIG. 5A as an example, will herein be omitted for brevity.

Among the control signals (PS1~PS6, TS1~TS2, RS, SS), each of the first and second row transfer signals (TS1~TS2), the pixel reset signal RS, and the row selection signal SS may have two logic levels (e.g., a high level and a low level), and each of the transistors (TX1~TX2, RX, SX) may be turned on upon receiving a high-level signal through a gate terminal thereof, and may be turned off upon receiving a low-level signal through a gate terminal thereof.

Among the above control signals (PS1~PS6, TS1~TS2, RS, SS), each of the first to sixth path selection signals (PS1~PS6) may have three logic levels (i.e., a high level, a medium level, and a low level). In some implementations, each of the first to sixth path transistors (PX1~PX6) may be turned on upon receiving a high-level signal through a gate terminal thereof, and may be turned off upon receiving a low-level signal through a gate terminal thereof. In some implementations, when each of the first to sixth path transistors (PX1~PX6) receives a medium-level signal through a gate terminal thereof, the first to sixth path transistors (PX1~PX6) can be half-turned on. When the overflown charges exceeding a predetermined amount of charges, e.g., the storage capacities of the first to sixth photoelectric conversion elements (PD1~PD6), are present in the first to sixth photoelectric conversion elements (PD1~PD6) capable of being respectively connected to one terminals of the first to sixth path transistors (PX1~PX6), the overflown charges can move to the first to second storage elements (RD1~RD2)

capable of being connected to the other terminals of the first to sixth path transistors (PX1~PX6).

Hereinafter, among the first to sixth path selection signals (PS1~PS6) that can be respectively supplied to the first to sixth path transistors (PX1~PX6), a logic level change with time of the first path selection signal PS1 to be applied to the first path transistor PX1 will be described. A description of the second to sixth path selection signals (PS2~PS6) will herein be omitted since substantially the same logic can be applied to the logic level change with time of the first path selection signal PS1. Among the first to second row transfer signals (TS1~TS2) that can be respectively supplied to the first to second transfer transistors (TX1~TX2), a logic level change with time of the first row transfer signal TS1 to be applied to the first transfer transistor TX1 will be described. A description of the second row transfer signal TS2 will herein be omitted since substantially the same logic can be applied to the logic level change with time of the first row transfer signal TS1. In addition, when reading out the pixel signals of the light subpixels (LSPs of FIG. 2), the image sensing device may output the reference signal of FIG. 1 by reading out the pixel signals after resetting the photoelectric conversion element included in the light subpixel (LSP of FIG. 2). Thereafter, the image sensing device may read out the pixel signals of the light subpixels (LSP of FIG. 2) that have generated photocharges generated by the photoelectric conversion element in response to incident light, and may thus output the image signal described in FIG. 1. Hereinafter, a description related to the reference signal output will herein be omitted for brevity.

An operation period in which the first light subpixel (LSP1 in FIG. 2) and the first storage subpixel (SSP1 in FIG. 2) connected to the first path transistor PX1 can generate and output signals corresponding to one frame can be briefly divided into four periods (i.e., A, B, C, and D periods). Hereinafter, operations of the first light subpixel LSP1 and the first storage subpixel SSP1 in each period will be described with further reference to FIGS. 7A to 7D.

Referring to FIGS. 5A, 6, and 7A to 7D, during the period A, the pixel reset signal RS may have a high level, and although not shown in FIG. 6, the row selection signal SS may have a low level. Accordingly, the reset transistor RX may be turned on and the selection transistor SX may be turned off. After the reset transistor RX is turned on, each of the first path selection signal PS1 and the first row transfer signal TS1 may have a high level. Accordingly, the first path transistor PX1 and the first transfer transistor TX1 may be turned on after the reset transistor RX is turned on. Before the period A is ended, the first path selection signal PS1 may have a medium level and the first row transfer signal may have a low level. Accordingly, the first path transistor PX1 may be half-turned on, and the first transfer transistor TX1 may be turned off. The above description is only an example, and other implementations are also possible. For example, in another example, not only the pixel reset signal RS but also the first path selection signal PS1 and the first row transfer signal TS1 may all have a high level in the entire period A.

In the period B, the first path selection signal PS1 may have a medium level, the first row transfer signal TS1 may have a low level, and the pixel reset signal RS may have a low level. In response to logic levels of the signals (PS1, TS1, RS) in the period B, the first path transistor PX1 may be half-turned on, the first transfer transistor TX1 may be turned off, and the reset transistor RX may be turned off.

In the period C, the first path selection signal PS1 may have a medium level, the first row transfer signal TS1 may have a low level, and the pixel reset signal RS may have a high level. In response to logic levels of the signals (PS1, TS1, RS) in the period C, the first path transistor PX1 may be half-turned on, the first transfer transistor TX1 may be turned off, and the reset transistor RX may be turned on.

In the period D, the pixel reset signal RS may have a low level, and although not shown in FIG. 6, the row selection signal SS may have a high level. Accordingly, the reset transistor RX may be turned off, and the selection transistor SX may be turned on. After the reset transistor RX is turned off, each of the first path selection signal PS1 and the first row transfer signal TS1 may have a high level. Accordingly, the first path transistor PX1 and the first transfer transistor TX1 may be turned on after the reset transistor RX is turned off. Before the period D is ended, each of the first path selection signal PS1 and the first row transfer signal TS1 may have a low level. Accordingly, each of the first path transistor PX1 and the first transfer transistor TX1 may be turned off. The above description is only an example, and other implementations are also possible. For example, in another example, both the first path selection signal PS1 and the first row transfer signal TS1 may all have a high level in the entire period B.

Referring to graphs of FIGS. 7A to 7D, the closer the potential of each period is to a bottom line of each graphs, the higher the potential of each region has. When each of the transistors (PX1, TX1, RX, SX) is turned off, a potential barrier is formed to prevent charge transfer between the source and the drain of each transistor. In addition, when each of the transistors (PX1, TX1, RX, SX) is turned on, charge transfer may be performed between the source and the drain of each transistor. Assuming that the potential of the first photoelectric conversion element PD1 is set to 'EP1' and the potential of the power-supply voltage VDD is set to 'EP3', the potential of the floating diffusion (FD) region can be assumed to be EP2, which is greater than EP1 and less than EP3. The potential of the first storage element RD1 may be greater than or equal to that of the first photoelectric conversion element PD1, and may be equal to or less than the potential of the floating diffusion (FD) region. In this case, if the potential of the first storage element RD1 is higher than that of the first photoelectric conversion element PD1, an additional gate structure and an additional fabrication process such as potential adjustment caused by impurity doping are required. In the following example, it is assumed that the first photoelectric conversion element PD1 has the same potential as the first storage element RD1 for convenience of description.

FIGS. 7A to 7D illustrate examples of potential distribution of a circuit (hereinafter referred to as a first unit circuit) that includes the first photoelectric conversion element PD1, the first path transistor PX1, the first storage element RD1, the first transfer transistor TX1, and the internal pixel circuit PC shown in FIG. 5A.

In the first period included in the period A of FIG. 6, which includes the first path selection signal PS1, the first row transfer signal TS1, and the pixel reset signal RS, each of which has a high level, since both the first path transistor PX1 and the first transfer transistor TX1 are turned on, the potential of the first path transistor PX1 may be the same as those of the first photoelectric conversion element PD1 and the first storage element RD1, and the potential of the first transfer transistor TX1 may be equal to or greater than the potential of the first storage element RD1 or may be equal to or less than that of the floating diffusion (FD) region (i.e., $EP1 \leq TX1$'s $potential \leq EP2$). As the reset transistor RX is also turned on, the potential of the reset transistor RX may be equal to or greater than the potential of the floating diffusion (FD) region, and may be equal to or less than the potential of the power-supply voltage VDD. According to the potential distribution of the first unit circuit, the photocharges that are generated and accumulated by the first photoelectric conversion element PD1 in response to the amount of incident light may move to the first storage element RD1 after passing through the first path transistor PX1, charges of the first storage element RD1 may move to the floating diffusion (FD) region after passing through the first transfer transistor TX1, and all charges of the floating diffusion (FD) region may be reset to the power-supply voltage VDD.

In the second period included in the period B of FIG. 6, the first path selection signal PS1 may have a medium level, the first row transfer signal TS1 may have a low level, and the pixel reset signal RS may have a low level. As the first path transistor PX1 is half-turned on in response to the first path selection signal PS1 having a medium level, the first path transistor PX1 may form a potential barrier (or the accumulated capacity Q) in the first photoelectric conversion element PD1 so that a predetermined amount of photocharges generated/accumulated in the first photoelectric conversion element PD1 can be prevented from moving to the first storage element RD1. When the amount of photocharges generated by the first photoelectric conversion element PD1 in response to incident light exceeding the predetermined amount Q, the overflown photocharges may move from the first photoelectric conversion element PD1 to the first storage element RD1 through the first path transistor PX1. As the first transfer transistor TX1 is turned off in response to the first row transfer signal TS1 having a low level, the first transfer transistor TX1 can prevent the photocharges that have moved to and been stored in the first storage element RD1 from moving to the floating diffusion (FD) region. The reset transistor RX may be turned off in response to the pixel reset signal RS having a low level, and may block the floating diffusion (FD) region from being reset to the power-supply voltage VDD. According to the potential distribution of the first unit circuit, unlike the related art in which photocharges generated by the first photoelectric conversion element PD1 in response to the amount of incident light are accumulated in the first photoelectric conversion element PD1 and overflown and the overflown photocharges cause the blooming phenomenon by moving toward other adjacent light subpixels, the image sensing device based on some implementations of the disclosed technology can prevent the overflown photocharges from moving toward other adjacent light subpixels by storing the overflown photocharges in the first storage element RD1. Thus, according to implementations of the disclosed technology, it is possible to prevent the blooming phenomenon.

In the third period included in the period C of FIG. 6, the first path selection signal PS1 may have a medium level, the first row transfer signal TS1 may have a low level, and the pixel reset signal RS may have a high level. In response to the first path selection signal PS1 having a medium level, the first path transistor PX1 may maintain a half-turned-on state to maintain the potential barrier Q, so that the first path transistor PX1 can serve as a path through which the overflown photocharges can move from the first photoelectric conversion element PD1 to the first storage element RD1. In response to the first row transfer signal TS1 having a low level, the first transfer transistor TX1 may maintain a turned-off state to block photocharges stored in the first storage element RD1 from moving to the floating diffusion (FD) region. In response to the pixel reset signal RS having a high level, the reset transistor RX may be turned on to reset the floating diffusion (FD) region to the power-supply voltage VDD. According to the potential distribution of the first unit circuit, the photocharges generated by the first photoelectric conversion element PD1 in response to the amount of incident light are accumulated in the first photoelectric conversion element PD1 even in the third period subsequent to the second period so that the overflown photocharges occur in the second and third periods, the overflown photocharges can move to the first storage element RD1 and be stored in the first storage element RD1 through the first path transistor PX1 instead of moving toward other adjacent light subpixels, and the floating diffusion (FD) region may be reset to the power-supply voltage VDD, resulting in increased accuracy of the pixel signal output of the first light subpixel LSP1.

In the fourth period included in the period D of FIG. 6, each of the first path selection signal PS1 and the first row transfer signal TS1 may have a high level, and the pixel reset signal RS may have a low level, both the first path transistor PX1 and the first transfer transistor TX1 are turned on, so that photocharges generated and accumulated in the first photoelectric conversion element PD1 may move to the first storage element RD1 after passing through the first path transistor PX1, and photocharges moved from the first photoelectric conversion element PD1 to the first storage element RD1 may move to the floating diffusion (FD) region after passing through the first transfer transistor TX1. As the reset transistor RX is turned off in response to the pixel reset signal RS having a low level, the reset transistor RX may block the photocharges having moved to the floating diffusion (FD) region from being reset to the power-supply voltage VDD. Although not shown in FIGS. 6 and 7D, the row selection signal SS may have a high level in the fourth period, and as the selection transistor SX is turned on in response to the row selection signal SS having a high level, a voltage level corresponding to the photocharges accumulated in the floating diffusion (FD) region may be output as an output voltage through the selection transistor SX through the drive transistor DX. According to the potential distribution of the first unit circuit, the voltage corresponding to photocharges that have been generated by the first photoelectric conversion element PD1 in response to the amount of incident light from the beginning of the second period may be transmitted to the CDS (130 in FIG. 1) through the selection transistor SX, thereby inducing the output of subsequent image signals.

The pixel signal of the first light subpixel (LSP1 in FIG. 2) may be read out according to signal level logics of the first to fourth periods, and logics having a predefined order that is substantially equal to the order of the signal level logics may be applied to the second to twelfth light subpixels (LSP2~LSP12 in FIG. 2). For example, after the signal level logic for the first light subpixel (LSP1 in FIG. 2) is finished, substantially the same logic as the signal level logic for the second light subpixel (LSP2 in FIG. 2) may then be executed. After the signal level logic substantially identical to the signal level logic for the second light subpixel (LSP2 in FIG. 2) is finished, substantially the same logic as the signal level logic for the third light subpixel (LSP3 in FIG. 2) may be executed. In this way, pixel signal timing control for the fourth to twelfth light subpixels (LSP4~LSP12 in FIG. 2) can be continuously performed.

Figure 7A:
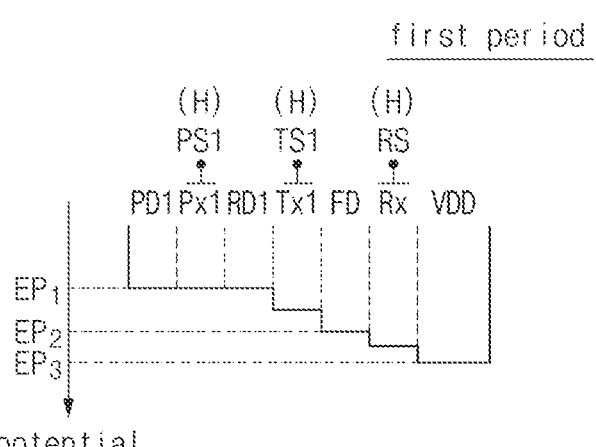
FIGS. 7A to 7D are distribution diagrams illustrating examples of potential distribution for each partial section of pixel signal timing points shown in FIG. 6, which may correspond to a timing diagram for an embodiment of the disclosed technology.
Figure 7B:
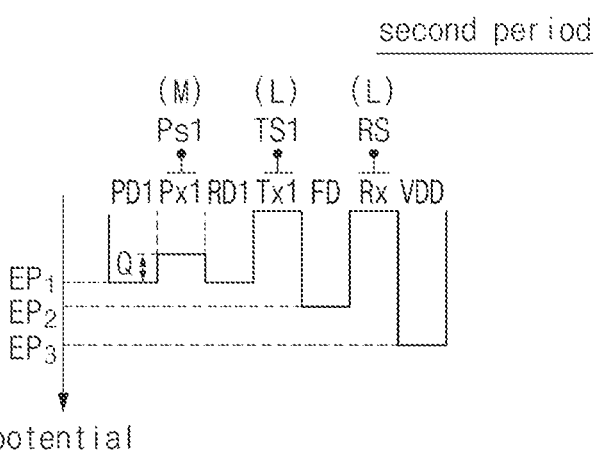
Figure 7C:
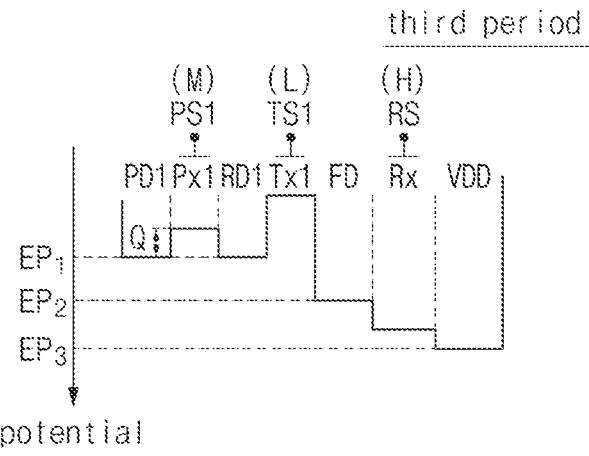
Figure 7D:
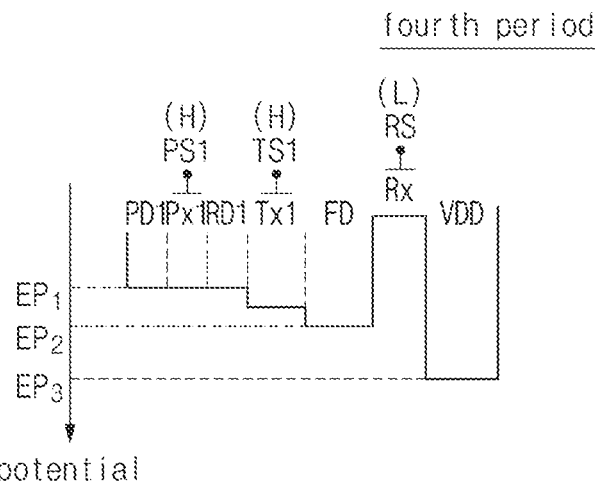

The scope of the disclosed technology is not limited only to the case where the potential distribution is the same as the above potential distribution. For example, as shown in FIG. 7A, if photocharges of the first photoelectric conversion element PD1 represent a potential distribution that can be reset through the first storage element RD1 and the floating diffusion (FD) region by the first path transistor PX1, the first transfer transistor TX1, and the reset transistor RX, such potential distribution can be construed as being the examples of the disclosed technology. As another example, as shown in FIG. 7D, after photocharges generated by the first photoelectric conversion element PD1 are stored in the first storage element RD1, if the photocharges represent a potential distribution along which the photocharges can be accumulated in the floating diffusion (FD) region after passing through the first storage element RD1 by the first path transistor PX1 and the first transfer transistor TX1, such potential distribution can be construed as being the examples of the disclosed technology.

One embodiment of the disclosed technology that can be implemented with reference to FIGS. 3A, 3C, 5B, 6, and 8A to 8D may include the above Embodiment 2. Hereinafter, in describing the pixel signal timing and the potential distribution for each period of the second embodiment (Embodiment 2) for convenience of description, the following description will be given below centering upon differences between the second embodiment (Embodiment 2) and the first embodiment (Embodiment 1).

Referring to FIGS. 3A, 3C, 5B, and 6, control signals (PS1~PS3, TS1~TS3, RS1, SS1) applied to the first pixel 310 capable of controlling a portion of the pixel group 300A shown in FIGS. 3A and 3C are illustrated in FIG. 5A. Signals substantially the same as the first to third path selection signals (PS1~PS3) respectively supplied to the first to third path transistors (PX1~PX3) may be supplied to the fourth to twelfth path transistors (PX4~PX12 in FIG. 3A), respectively. In addition, signals substantially the same as the first to third row transfer signals (TS1~TS3) respectively supplied to the first to third transfer transistors (TX1~TX3) may be supplied to the fourth to twelfth transfer transistors (TX4~TX12 in FIG. 3C). Hereinafter, a description of the transistors (PX4~PX12, TX4~TX12) not shown in the first pixel circuit 310PC of FIG. 5B will herein be omitted for brevity.

Among the control signals (PS1~PS3, TS1~TS3, RS1, SS1), the first to third row transfer signals (TS1~TS3), the first pixel reset signal RS1, and the first row selection signal SS1 may have two logic levels (i.e., a high level and a low level), and each transistor (TX1~TX3, RX1, SX1) may be turned on upon receiving a high-level signal through a gate terminal thereof and may be turned off upon receiving a low-level signal through a gate terminal thereof.

Among the control signals (PS1~PS3, TS1~TS3, RS1, SS1), the first to third path selection signals (PS1~PS3) may have three logic levels (i.e., a high level, a medium level, and a low level). In some implementations, each of the first to third path transistors (PX1~PX3) may be turned on upon receiving a high-level signal through a gate terminal thereof, and may be turned off upon receiving a low-level signal through a gate terminal thereof. In some implementations, when each of the first to third path transistors (PX1~PX3) receives a medium-level signal through a gate terminal thereof, the first to sixth path transistors (PX1~PX6) can be half-turned on. The first to sixth path transistors (PX1~PX6) can be half-turned on to allow the overflown charges to move to the first storage element RD1 that can be connected to each of the first to third path transistors (PX1~PX3). The overflown charges correspond to an excess amount of the photocharges that are generated to exceed a predetermined amount of charges of the first to third photoelectric conversion elements (PD1~PD3) that can be respectively connected to one terminals of the first to third path transistors (PX1~PX3)

Hereinafter, among the first to third path selection signals (PS1~PS3) that can be respectively supplied to the first to third path transistors (PX1~PX3), how the logic level of the first path selection signal (PS1) applied to the first path transistor PX1 changes with time will be described. A description of the second and third path selection signals (PS2~PS3) will herein be omitted since substantially the same logic as discussed for the first path selection signal (PS1) can be applied to the second and third path selection signals (PS2 and PS3). Among the first to third row transfer signals (TS1~TS3) that can be respectively supplied to the first to third transfer transistors (TX1~TX3), how the logic level of the first row transfer signal TS1 applied to the first transfer transistor TX1 changes with time will hereinafter be described. A description of the second and third row transfer signals (TS2~TS3) will herein be omitted for brevity since the logic level change representing how the logic level of the first row transfer signal TS1 changes with time can be used in the substantially same manner. Among the first to third row transfer signals (TS1~TS3) that can be respectively supplied to the first to third transfer transistors (TX1~TX3), how the logic level of the first row transfer signal TS1 applied to the first transfer transistor TX1 changes with time will hereinafter be described. A description of the second and third row transfer signals (TS2~TS3) will herein be omitted for brevity since the logic level change representing how the logic level of the first row transfer signal TS1 changes with time can be used in the substantially same manner. In addition, when reading out the pixel signals of the light subpixels (LSPs of FIG. 2), after resetting the photoelectric conversion elements included in the light subpixels (LSPs of FIG. 2), the pixel signal may be read out to output the reference signal of FIG. 1. Then, the pixel signal of the light subpixel (LSP of FIG. 2) in which the photoelectric conversion element generates photocharges in response to incident light may be read out to output the image signal of FIG. 1. Hereinafter, a description of the reference signal output will herein be omitted for brevity.

An operation period in which the first light subpixel (LSP1 in FIG. 2) and the first storage subpixel (SSP1 in FIG. 2) connected to the first path transistor PX1 can generate and output some signals corresponding to one frame can be briefly divided into four periods (A~D) in the same manner as in the first embodiment (Embodiment 1). Hereinafter, operations of the first light subpixel LSP1 and the first storage subpixel SSP1 in each period will be described with further reference to FIGS. 8A to 8D.

Referring to FIGS. 5B, 6, and 8A to 8D, pixel control signals generated according to substantially the same timing diagrams can be applied to both of Embodiment 1 and Embodiment 2 in the four periods (A~D). In Embodiment 2, the first photoelectric conversion element PD1 can be reset in the period A, photocharges generated in response to the amount of incident light can be stored in the period B, the floating diffusion regions (FD, FD1) can be reset in the period C, and the first light subpixel (LSP1 of FIG. 2) can be read out in the period D, as in the first embodiment (Embodiment 1).

When the positions of the first photoelectric conversion element PD1 and the first storage element RD1 of FIGS. 8A to 8D are compared with the positions of the first photoelectric conversion element PD1 and the first storage element RD1 of FIGS. 7A to 7D by referring to the supply of the pixel control signals based on the substantially same timing diagrams, the remaining potential distribution characteristics except for some differences in which the positions of the above elements PD1 and RD1 of FIGS. 8A to 8D are interchanged with the positions of the elements PD1 and RD1 of FIGS. 7A to 7D can be substantially equally applied to both of Embodiment 1 and Embodiment 2. That is, Embodiment 1 and Embodiment 2 may use substantially the same potential distribution.

In Embodiment 2, unlike Embodiment 1, the first to fourth pixels (310, 320, 330, 340) may not share the internal pixel circuit (PC). The first pixel 310 may include the first pixel circuit 310PC that includes a first floating diffusion region FD1, a first reset transistor RX1, a first drive transistor DX1, and a first selection transistor SX1. The second pixel 320 may include a second pixel circuit that includes a second floating diffusion region FD2, a second reset transistor RX2, a second drive transistor DX2, and a second selection transistor SX2. The third pixel 330 may include a third pixel circuit that includes a third floating diffusion region FD3, a third reset transistor RX3, a third drive transistor DX3, and a third selection transistor SX3. The fourth pixel 340 may include a fourth pixel circuit that includes a fourth floating diffusion region FD4, a fourth reset transistor RX4, a fourth drive transistor DX4, and a fourth selection transistor SX4. The first pixel circuit 310PC, the second pixel circuit, the third pixel circuit, and the fourth pixel circuit can be controlled independently from each other. For example, the timing control corresponding to the predetermined periods A to D may be performed simultaneously for the first pixel 310 and the second pixel 320, or the timing control of the second pixel 320 may be performed after expiration of the timing control of the first pixel 310. Control of light subpixels (LSPs in FIG. 2) included in each of the first to fourth pixels (310, 320, 330, 340) may be sequentially controlled as described in the description of Embodiment 1. For example, in the first pixel 310, after one pixel control signal cycle corresponding to the periods A to D is completed for the first light subpixel (LSP1 in FIG. 2), the pixel control signal cycle for the second light subpixel (LSP2 in FIG. 2) may be started.

Figure 8A:
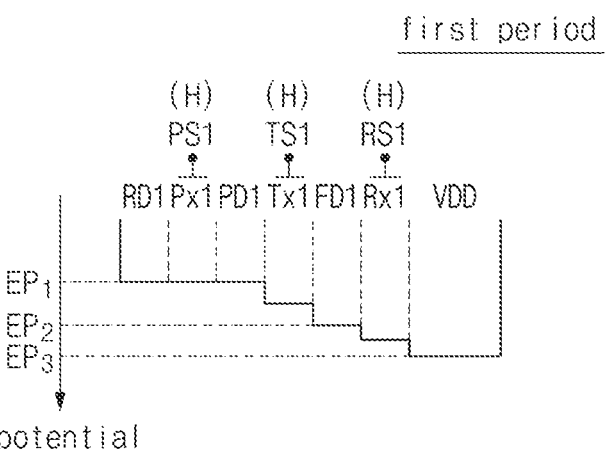
FIGS. 8A to 8D are distribution diagrams illustrating examples of potential distribution for each partial section of pixel signal timing points shown in FIG. 6, which may correspond to a timing diagram for another embodiment of the disclosed technology.
Figure 8B:
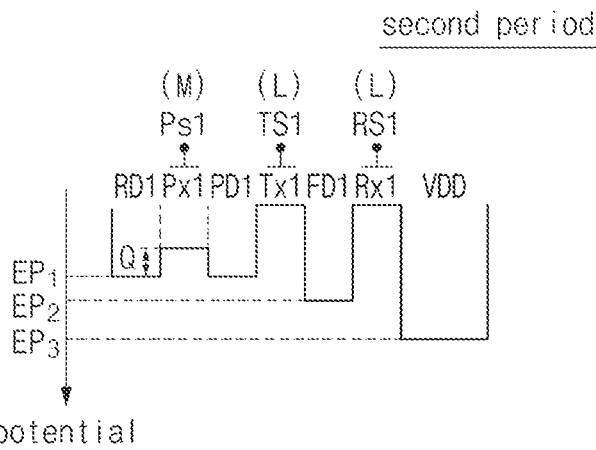
Figure 8C:
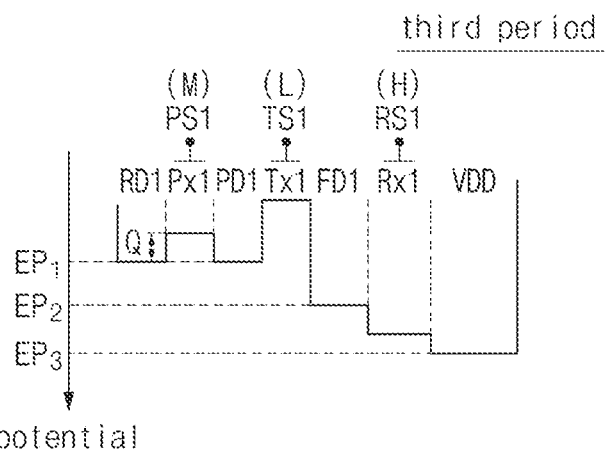
Figure 8D:
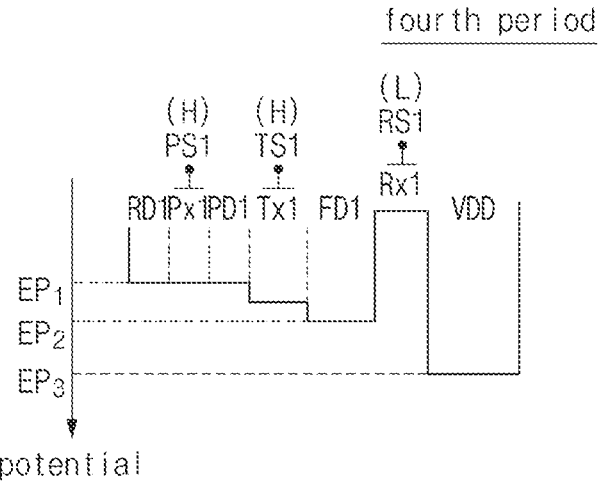

In addition, the scope of the disclosed technology is not limited only to the example case in which the potential distribution is the same as the potential distribution in FIGS. 8A to 8D. For example, as shown in FIG. 8A, as long as photocharges stored in the first storage element RD1 and the first photoelectric conversion element PD1 have a potential distribution along which the photocharges can be reset by the first path transistor PX1, the first transfer transistor TX1, and the reset transistor RX through the first floating diffusion region FD1, the content related to such photocharges can be construed as being within the scope of one embodiment of the disclosed technology. As another example, as shown in FIG. 8D, as long as photocharges stored in each of the first photoelectric conversion element PD1 and the first storage element RD1 to read out the first light subpixel (LSP1 in FIG. 2) have a potential distribution along which the photocharges can be stored in the first floating diffusion region FD1 after moving to the first floating diffusion region FD1 by the first path transistor PX1 and the first transfer transistor TX1, the content related to such photocharges can be construed as being within the scope of one embodiment of the disclosed technology.

As is apparent from the above description, the image sensing device based on some implementations of the disclosed technology may perform focusing by comparing signals of left/right/upper/lower pixels located around the plurality of subpixels, and may normally read pixel signals by including storage subpixels capable of storing overflown photocharges of pixels previously saturated by incident light, thereby increasing the storage capacity capable of storing generated photocharges. In addition, the image sensing device based on some implementations of the disclosed technology can prevent increase of error signals that may occur in other pixels affected by a blooming phenomenon.

The embodiments of the disclosed technology may be implemented to provide a variety of effects for various applications.

Although a number of illustrative embodiments have been described, it should be understood that modifications and/or enhancements to the disclosed embodiments and other embodiments can be devised based on what is described and/or illustrated in this patent document.

What is claimed is:

1. An image sensing device, comprising:

first to third light subpixels configured to include first to third photoelectric conversion elements, respectively, each of the first to third photoelectric conversion elements configured to generate photocharges indicative of incident light received by each photoelectric conversion element;

a first storage subpixel including a first storage element configured to store overflown photocharges that correspond to an excess of photocharges that are generated to exceed predetermined capacities of the first to third photoelectric conversion elements; and each of first to third path transistors electrically connected between the first storage element and each of the first to third photoelectric conversion elements, respectively, wherein the first to third light subpixels and the first storage subpixel are arranged in a (2×2) matrix to form a first pixel.

2. The image sensing device according to claim 1, wherein:

the first light subpixel includes a first optical filter configured to transmit light of a first color;

the second light subpixel includes a second optical filter configured to transmit light of a second color;

the third light subpixel includes a third optical filter configured to transmit light of a third color; and the first storage subpixel includes a first light blocking structure.

3. The image sensing device according to claim 2, wherein:

the first to third colors are same as one another.

4. The image sensing device according to claim 1, further comprising:

a first floating diffusion region configured to accumulate the photocharges generated by the first to third photoelectric conversion elements; and a row driver configured to supply a pixel control signal to a pixel array including the first pixel.

5. The image sensing device according to claim 4, further comprising:

a reset transistor configured to reset the first floating diffusion region to a power-supply voltage in response to a pixel reset signal received from the row driver;

a drive transistor configured to convert a potential of the first floating diffusion region into an electrical signal; and a selection transistor configured to output the electrical signal in response to a row selection signal received from the row driver.

6. The image sensing device according to claim 5, wherein:

the pixel control signal includes a path selection signal supplied to the first path transistor, a row transfer signal supplied to a transfer transistor, the pixel reset signal, and the row selection signal, wherein the transfer transistor is electrically connected between the first floating diffusion region and any one of the first photoelectric conversion element and the first storage element, wherein the path selection signal has a high level, a low level, or a medium level that is lower than the high level and higher than the low level; and each of the row transfer signal, the pixel reset signal, and the row selection signal has the high level or the low level.

7. The image sensing device according to claim 6, wherein:

an operation period of the first light subpixel includes:

a first period configured to remove photocharges present in the first photoelectric conversion element and the first storage element;

a second period configured to accumulate photocharges corresponding to the incident light;

a third period configured to reset the first floating diffusion region; and a fourth period configured to read out the first light subpixel.

8. The image sensing device according to claim 7, wherein:

in the first period, the first path transistor and the transfer transistor are configured to move the photocharges present in the first photoelectric conversion element and the first storage element to the first floating diffusion region in response to each of the path selection signal having the high level and the row transfer signal having the high level; and the reset transistor is configured to reset the first floating diffusion region storing the photocharges to a power-supply voltage in response to the pixel reset signal having the high level.

9. The image sensing device according to claim 7, wherein:

in the second period, the first path transistor is configured to move the photocharges generated from the first photoelectric conversion element to the first storage element in response to the path selection signal having the medium level; and the transfer transistor is configured to block the photocharges generated by the first photoelectric conversion element from moving to the first floating diffusion region in response to the row transfer signal having the low level.

10. The image sensing device according to claim 7, wherein:

in the third period, the transfer transistor is configured to block the photocharges generated by the first photoelectric conversion element from moving to the first floating diffusion region in response to the row transfer signal having the low level; and the reset transistor is configured to reset the first floating diffusion region to a power-supply voltage in response to the pixel reset signal having the high level.

11. The image sensing device according to claim 7, wherein:

in the fourth period, the first path transistor and the transfer transistor are configured to move the photocharges generated by the first photoelectric conversion element to the first floating diffusion region in response to each of the path selection signal having the high level and the row transfer signal having the high level;

the reset transistor is configured to prevent the first floating diffusion region from being reset to a power-supply voltage in response to the pixel reset signal having the low level; and the selection transistor is configured to output an electrical signal corresponding to the photocharges of the first floating diffusion region in response to the row selection signal having the high level.

12. The image sensing device according to claim 5, further comprising:

first to third transfer transistors respectively electrically connected between the first floating diffusion region and each of the first to third photoelectric conversion elements, respectively.

13. The image sensing device according to claim 5, further comprising:

a second pixel configured to have fourth to sixth light subpixels and a second storage subpixel;

a third pixel configured to have seventh to ninth light subpixels and a third storage subpixel;

a fourth pixel configured to have tenth to twelfth light subpixels and a fourth storage subpixel;

fourth to twelfth photoelectric conversion elements respectively included in the fourth to twelfth light subpixels; and second to fourth storage elements respectively included in the second to fourth storage subpixels, wherein the fourth to sixth light subpixels and the second storage subpixel are arranged in a (2×2) matrix structure to form the second pixel;

the seventh to ninth light subpixels and the third storage subpixel are arranged in a (2×2) matrix structure to form the third pixel; and the tenth to twelfth light subpixels and the fourth storage subpixel are arranged in a (2×2) matrix structure to form the fourth pixel.

14. The image sensing device according to claim 13, further comprising:

each of first to fourth transfer transistors electrically connected between the first floating diffusion region and each of the first to fourth storage elements, respectively.

15. The image sensing device according to claim 13, wherein:

the second pixel is adjacent to the first pixel in a column direction;

the third pixel is adjacent to the first pixel in a row direction; and the fourth pixel is adjacent to each of the second pixel and the third pixel, and is disposed in a diagonal direction from the first pixel.

16. The image sensing device according to claim 13, wherein:

each of the first to third light subpixels includes a first optical filter configured to transmit light of a first color;

each of the fourth to sixth light subpixels includes a second optical filter configured to transmit light of a second color;

each of the seventh to ninth light subpixels includes a third optical filter configured to transmit light of a third color;

each of the tenth to twelfth light subpixels includes a fourth optical filter configured to transmit light of a fourth color; and the first to fourth storage subpixels include first to fourth light blocking structures, respectively.

17. The image sensing device according to claim 16, wherein:

the first to fourth colors are different from one other.

18. The image sensing device according to claim 16, wherein:

the first color is green, the second color is red, and the third color is blue.

19. The image sensing device according to claim 13, further comprising:

a second floating diffusion region configured to accumulate the photocharges generated by the fourth to sixth photoelectric conversion elements;

a third floating diffusion region configured to accumulate the photocharges generated by the seventh to ninth photoelectric conversion elements;

a fourth floating diffusion region configured to accumulate the photocharges generated by the tenth to twelfth photoelectric conversion elements;

first to third transfer transistors respectively connected between the first floating diffusion region and each of the first to third photoelectric conversion elements;

fourth to sixth transfer transistors respectively connected between the second floating diffusion region and each of the fourth to sixth photoelectric conversion elements;

seventh to ninth transfer transistors respectively connected between the third floating diffusion region and each of the seventh to ninth photoelectric conversion elements; and tenth to twelfth transfer transistors respectively connected between the fourth floating diffusion region and each of the tenth to twelfth photoelectric conversion elements.

20. A method for operating an image sensing device, comprising:

operating the image sensing device to perform a photocharge accumulation operation by applying a path selection signal having a first level to a path transistor electrically connected between a photoelectric conversion element configured to generate photocharges in response to incident light and a storage element storing the photocharges to form a predetermined charge barrier and restrict a movement of a photocharge between the photoelectric conversion element and the storage element; and operating the image sensing device to perform a pixel readout operation by applying the path selection signal having a second level higher than the first level to the path transistor to remove the predetermined charge barrier formed between the photoelectric conversion element and the storage element, wherein the photocharges move from the photoelectric conversion element to the storage element during the photocharge accumulation operation and the photocharges move to a floating diffusion region during the pixel readout operation.

21. The method according to claim 20, wherein the photocharge accumulation operation further includes:

applying a pixel reset signal having the second level to a reset transistor electrically connected between the floating diffusion region and a power-supply voltage to reset a voltage of the floating diffusion region to the power-supply voltage.

22. The method according to claim 20, wherein the pixel readout operation further includes:

applying a pixel reset signal having a third level less than the first level to a reset transistor disposed between the floating diffusion region and a power-supply voltage such that photocharges that have moved to the floating diffusion region are prevented from being reset to the power-supply voltage.

23. The method according to claim 20, wherein:

the photocharges generated by the photoelectric conversion element move to the floating diffusion region by applying a row transfer signal having the second level to a transfer transistor that is connected between the storage element and the floating diffusion region or between the photoelectric conversion element and the floating diffusion region.

* * * * *